(12) United States Patent  
Kim et al.

(10) Patent No.: US 12,144,171 B2  
(45) Date of Patent: Nov. 12, 2024

(54) SEMICONDUCTOR DEVICE INCLUDING SELECT CUTTING STRUCTURE, METHOD FOR MANUFACTURING THE SAME AND ELECTRONIC SYSTEM INCLUDING THE SAME

(71) Applicant: Samsung Electronics Co., Ltd., Suwon-si (KR)

(72) Inventors: Choasub Kim, Suwon-si (KR); Dongmin Kyeon, Seongnam-si (KR); Hayan Park, Hwaseong-si (KR); Youngsun Cho, Seongnam-si (KR); Changhyun Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 394 days.

(21) Appl. No.: 17/557,642

(22) Filed: Dec. 21, 2021

(65) Prior Publication Data

US 2022/0392911 A1 Dec. 8, 2022

(30) Foreign Application Priority Data

Jun. 3, 2021 (KR) .................. 10-2021-0072087

(51) Int. Cl.
| | |
|---|---|
| *H10B 41/41* | (2023.01) |
| *H01L 23/528* | (2006.01) |
| *H10B 41/10* | (2023.01) |
| *H10B 41/27* | (2023.01) |
| *H10B 41/35* | (2023.01) |

(Continued)

(52) U.S. Cl.  
CPC ......... *H10B 41/41* (2023.02); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 43/40* (2023.02)

(58) Field of Classification Search  
CPC .................................................. H10B 43/10  
See application file for complete search history.

(56) References Cited

U.S. PATENT DOCUMENTS 9,806,093 B2 * 10/2017 Toyama ................. H10B 43/35  
10,515,974 B2 12/2019 Lee et al.  
(Continued)

FOREIGN PATENT DOCUMENTS

KR 20150116995 A 10/2015  
KR 20180135643 A 12/2018  
(Continued)

*Primary Examiner* — Matthew L Reames  
(74) *Attorney, Agent, or Firm* — Myers Bigel, P.A.

(57) ABSTRACT

A semiconductor device of the disclosure includes a peripheral circuit structure including a peripheral transistor, a semiconductor layer on the peripheral circuit structure, a source structure on the semiconductor layer, a gate stack structure on the source structure, the gate stack structure including a word line, a gate upper line and a staircase structure, a memory channel structure and a dummy channel structure extending through the gate stack structure, a cut structure extending through the gate upper line, and a bit line overlapping with the memory channel structure. The cut structure includes a narrow section, and a wide section nearer to the staircase structure than the narrow section. A width of the narrow section is less than a width of the wide section.

20 Claims, 18 Drawing Sheets

(51) Int. Cl.
*H10B 43/10* (2023.01)
*H10B 43/27* (2023.01)
*H10B 43/35* (2023.01)
*H10B 43/40* (2023.01)

(56) References Cited

U.S. PATENT DOCUMENTS

| | | |
|---|---|---|
| 10,529,734 B2 | 1/2020 | Ku et al. |
| 10,566,346 B2 | 2/2020 | Lee et al. |
| 10,672,781 B2 | 6/2020 | Lee et al. |
| 10,680,007 B2 | 6/2020 | Shin et al. |
| 10,957,708 B2 | 3/2021 | Jung et al. |
| 2014/0063890 A1 | 3/2014 | Lee et al. |
| 2019/0355736 A1 | 11/2019 | Kang et al. |
| 2020/0144290 A1 | 5/2020 | Ku et al. |
| 2020/0185412 A1 | 6/2020 | Lee et al. |
| 2020/0295016 A1 | 9/2020 | Harada et al. |
| 2020/0303413 A1 | 9/2020 | Shin et al. |

FOREIGN PATENT DOCUMENTS

| | | |
|---|---|---|
| KR | 20180138380 A | 12/2018 |
| KR | 20190009070 A | 1/2019 |
| KR | 20190093987 A | 8/2019 |
| KR | 20190132059 A | 11/2019 |
| KR | 20200052137 A | 5/2020 |

\* cited by examiner

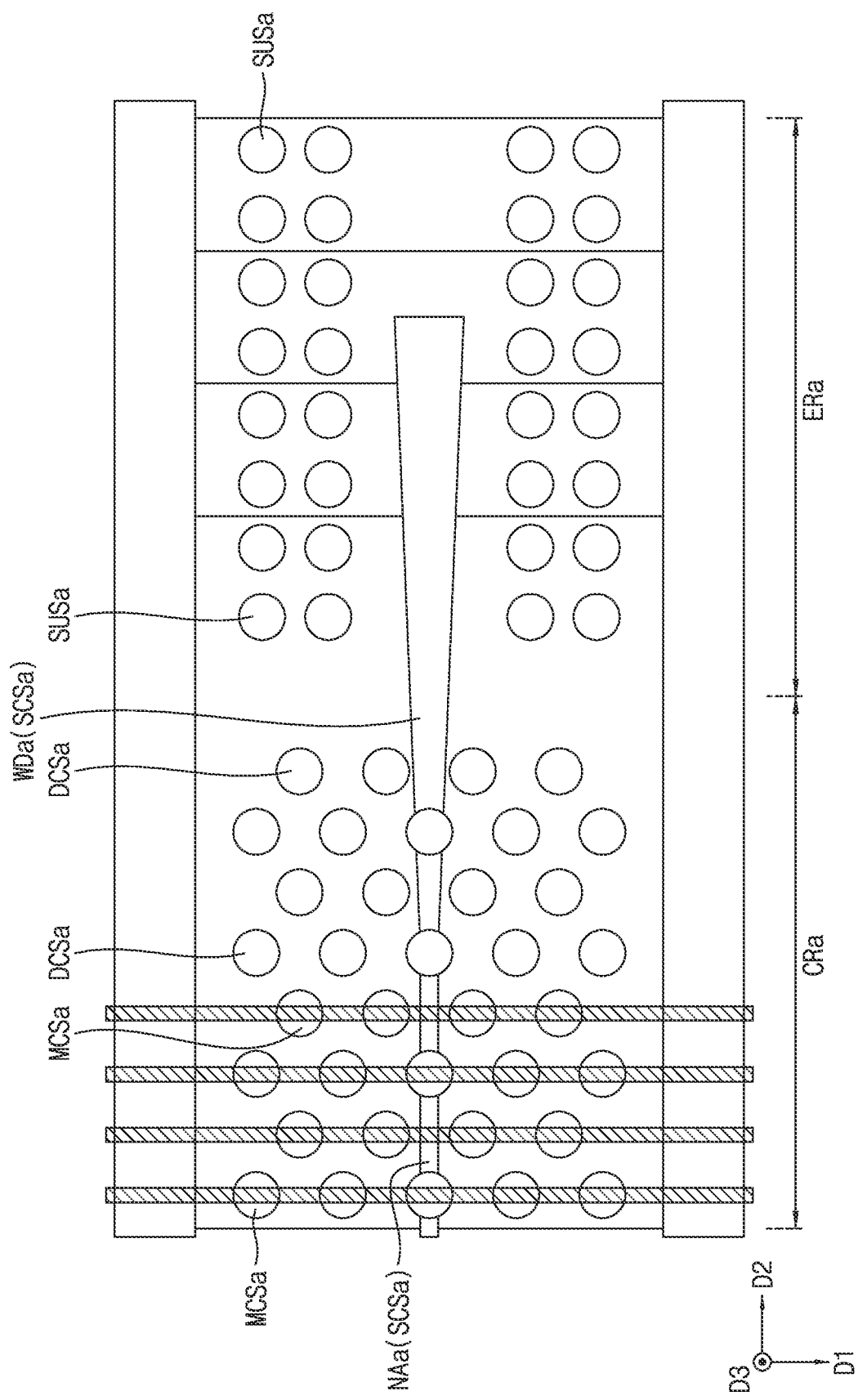

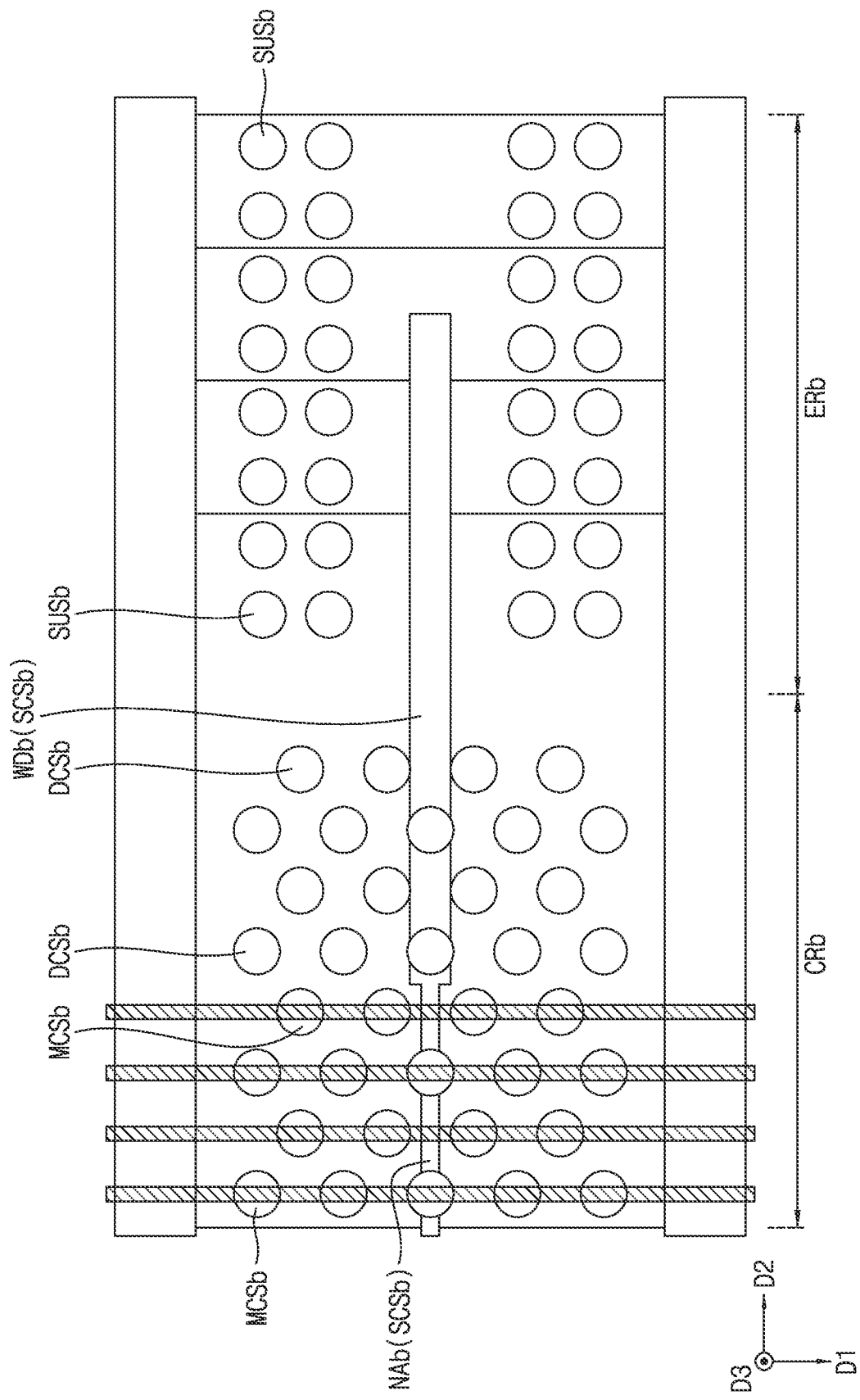

SEMICONDUCTOR DEVICE INCLUDING SELECT CUTTING STRUCTURE, METHOD FOR MANUFACTURING THE SAME AND ELECTRONIC SYSTEM INCLUDING THE SAME

CROSS-REFERENCE TO THE RELATED APPLICATION

This application claims priority from Korean Patent Application No. 10-2021-0072087, filed on Jun. 3, 2021, in the Korean Intellectual Property Office, the disclosure of which is incorporated herein by reference in its entirety.

BACKGROUND

1. Field

The example embodiments of the disclosure relate to a semiconductor device, a method for manufacturing the same and an electronic system including the same. In particular, the example embodiments of the disclosure relate to a semiconductor device including a cut structure, a method for manufacturing the same and an electronic system including the same.

2. Description of the Related Art

In an electronic system requiring storage of data, a semiconductor device capable of storing large volumes of data is needed. Accordingly, research on a scheme capable of increasing the data storage capacity of a semiconductor device is being conducted. For example, as one of methods for increasing the data storage capacity of a semiconductor device, a semiconductor device including three-dimensionally arranged memory cells in place of two-dimensionally arranged memory cells is proposed.

SUMMARY

The example embodiments of the disclosure provide a semiconductor device having enhanced electrical characteristics.

The example embodiments of the disclosure provide an electronic system including a semiconductor device having enhanced electrical characteristics.

A semiconductor device according to example embodiments of the disclosure may include a peripheral circuit structure including a peripheral transistor, a semiconductor layer on the peripheral circuit structure, a source structure on the semiconductor layer, a gate stack structure on the source structure, the gate stack structure including a word line, a gate upper line and a staircase structure, a memory channel structure and a dummy channel structure extending through the gate stack structure, a cut structure extending through the gate upper line, and a bit line overlapping with the memory channel structure. The cut structure may include a narrow section, and a wide section nearer to the staircase structure than the narrow section. A width of the narrow section may be less than a width of the wide section.

A semiconductor device according to example embodiments of the disclosure may include a gate stack structure including a word line and a gate upper line, memory channel structures and dummy channel structures extending through the gate stack structure, and a cut structure extending through the gate upper line. The cut structure may include a narrow section, and a wide section having a greater width than the narrow section. The memory channel structures may include a first memory channel structure contacting the narrow section. The dummy channel structures may include a first dummy channel structure contacting the wide section.

An electronic system according to example embodiments of the disclosure may include a main substrate, a semiconductor device on the main substrate, and a controller electrically connected to the semiconductor device on the main substrate. The semiconductor device may include a gate stack structure including a word line and a gate upper line, a memory channel structure and a support structure extending through the gate stack structure, and a cut structure extending through the gate upper line. The cut structure may include a narrow section adjacent to the memory channel structure, and a wide section adjacent to the support structure. A width of the narrow section may be less than a width of the wide section.

A method for manufacturing a semiconductor device in accordance with example embodiments of the disclosure may include forming a gate stack structure including stack insulating films and stack sacrificial films alternately stacked, forming a staircase structure at the gate stack structure, forming a cover insulating film covering the staircase structure, forming a cut trench extending through the cover insulating film and an uppermost one of the stack sacrificial films, and forming a cut structure filling the cut trench. A width of the cut trench may be gradually increased as the cut trench extends toward the staircase structure.

BRIEF DESCRIPTION OF THE DRAWINGS

FIG. 8 is a plan view of a semiconductor device according to example embodiments of the disclosure.

FIG. 9 is a plan view of a semiconductor device according to example embodiments of the disclosure.

DETAILED DESCRIPTION OF EXAMPLE EMBODIMENTS

Hereinafter, the example embodiments of the disclosure will be described with reference to the accompanying drawings.

Figure 1:
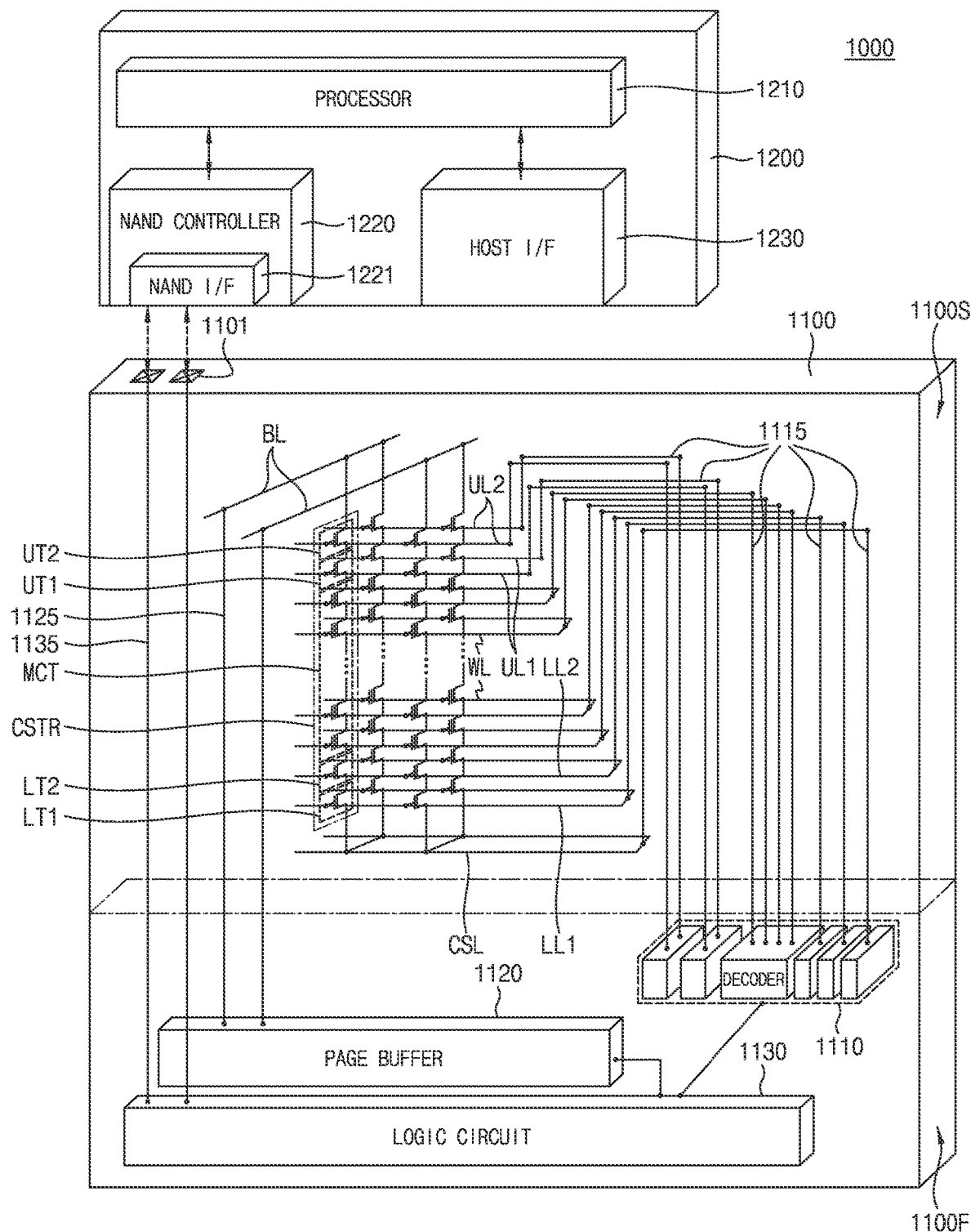
FIG. 1 is a view schematically showing an electronic system including a semiconductor device according to example embodiments of the disclosure.

FIG. 1 is a view schematically showing an electronic system including a semiconductor device according to example embodiments of the disclosure.

Referring to FIG. 1, an electronic system 1000 according to example embodiments of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB) thumb drive, a computing system, a medical device or a communication device which includes one semiconductor device 1100 or a plurality of semiconductor devices 1100.

The semiconductor device 1100 may be a non-volatile memory device. For example, the semiconductor device 1100 may be a NAND flash memory device which will be described later with reference to FIGS. 5A to 5E. The semiconductor device 1100 may include a first structure 1100F, and a second structure 1100S on the first structure 1100F. In example embodiments, the first structure 1100F may be disposed at one side of the second structure 1100S. The first structure 1100F may be a peripheral circuit structure including a decoder circuit 1110, a page buffer 1120 and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments.

In example embodiments, the upper transistors UT1 and UT2 may include a string selection transistor, whereas the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, respectively. The gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 via first connecting lines 1115 extending from an inside of the first structure 1100F to the second structure 1100S. The bit lines BL may be electrically connected to the page buffer 1120 via second connecting lines 1125 extending from the inside of the first structure 1100F to the second structure 1100S.

In the first structure 1100F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 via an input/output connecting line 1135 extending from the inside of the first structure 1100F to the second structure 1100S.

The controller 1200 may include a processor 1210, a NAND controller 1220, and a host interface 1230. In accordance with example embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 2:
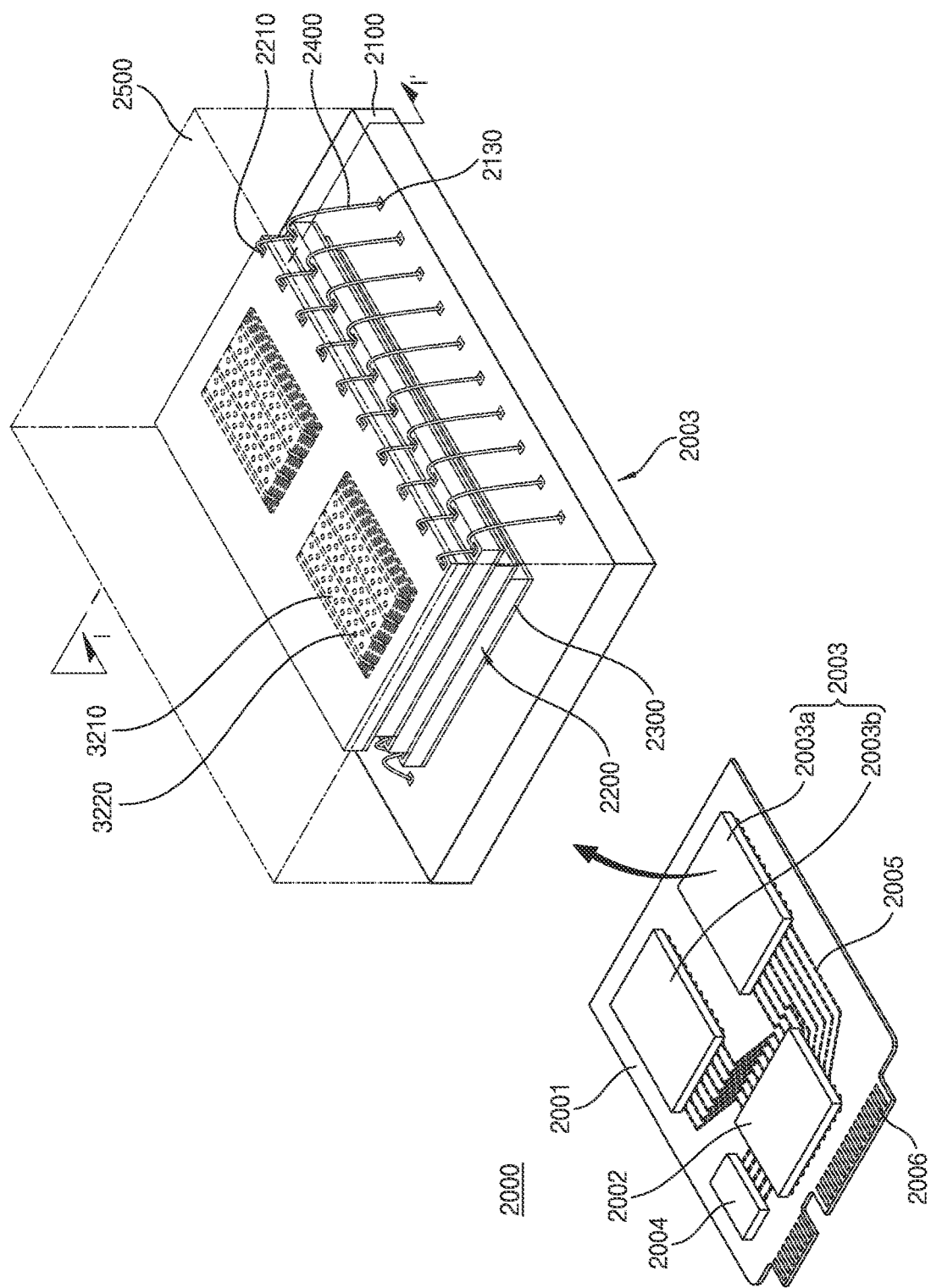
FIG. 2 is a perspective view schematically showing an electronic system including a semiconductor device according to example embodiments of the disclosure.

FIG. 2 is a perspective view schematically showing an electronic system including a semiconductor device according to example embodiments of the disclosure.

Referring to FIG. 2, an electronic system 2000 according to example embodiments of the disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In example embodiments, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In example embodiments, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, bonding layers 2300 respectively disposed at bottom surfaces of the semiconductor chips 2200, a connecting structure 2400 for electrically connecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stack structures 3210 and memory channel structures 3220. Each of the semiconductor chips 2200 may include a semiconductor device which will be described later with reference to FIGS. 5A to 5E.

In example embodiments, the connecting structure 2400 may be a bonding wire for electrically connecting the input/output pad 2210 and the package upper pads 2130. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In accordance with embodiments, in each of the first and second semiconductor packages 2003a and 2003b, the semiconductor chips 2200 may be electrically interconnected by a connecting structure including a through-silicon via (TSV) in place of the bonding wire type connecting structure 2400.

In example embodiments, the controller 2002 and the semiconductor chips 2200 may be included in one package. In example embodiments, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 3:
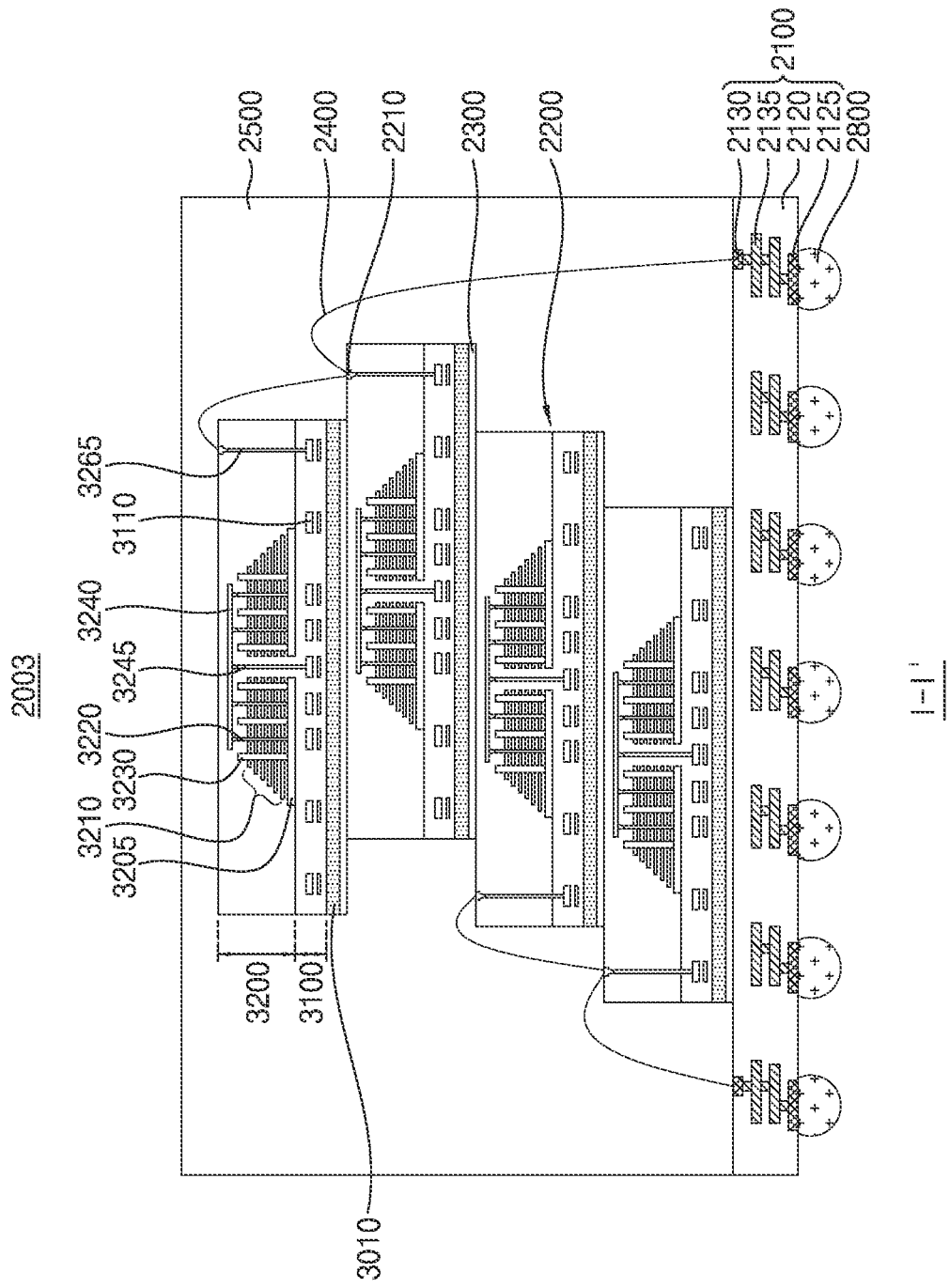
FIGS. 3 and 4 are sectional views schematically showing semiconductor packages according to example embodiments of the disclosure.
Figure 4:
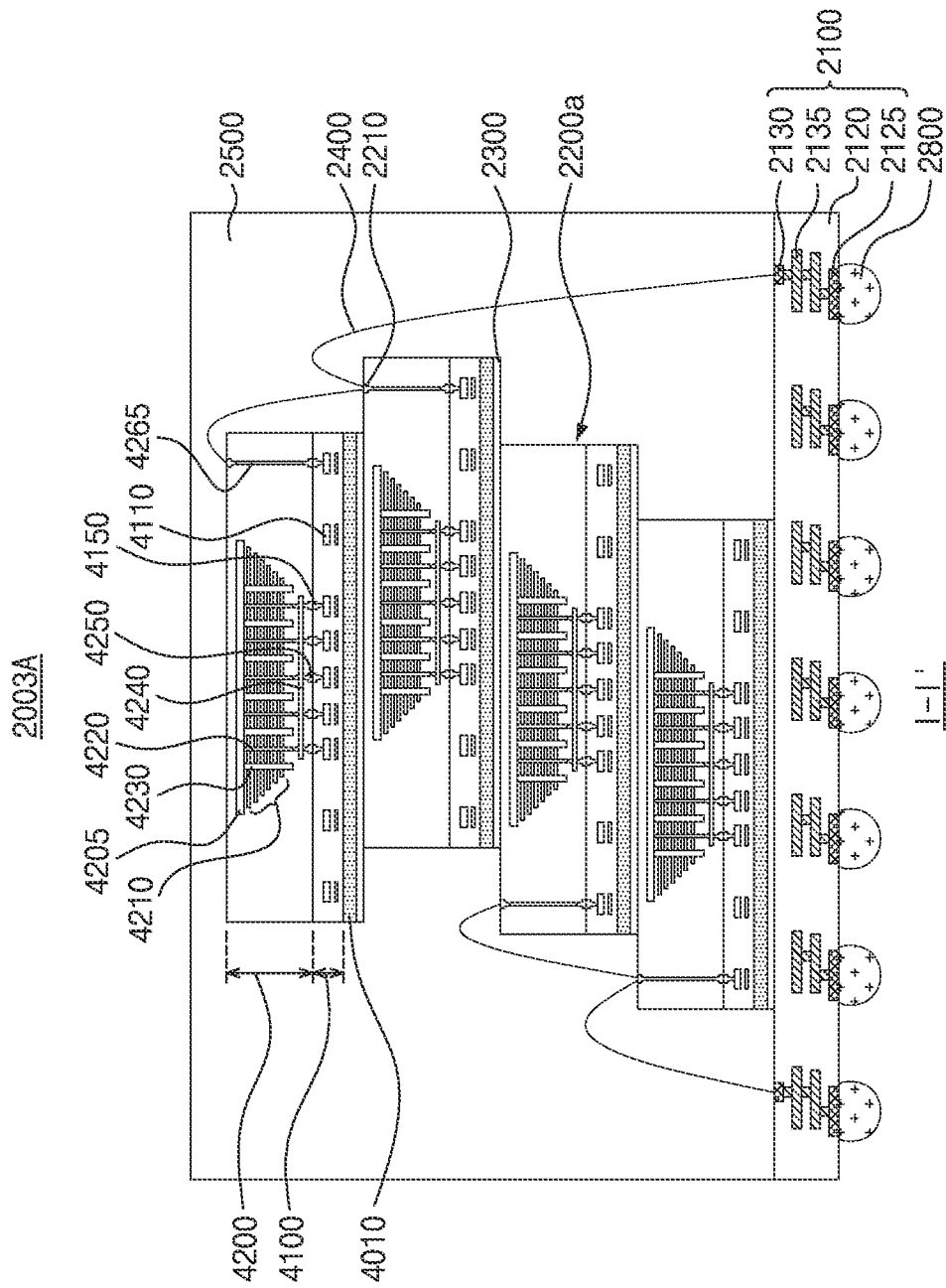

FIGS. 3 and 4 are sectional views schematically showing semiconductor packages according to example embodiments of the disclosure. Each of FIGS. 3 and 4 explains an example embodiment of the semiconductor package 2003 of FIG. 2, and conceptually shows an area of the semiconductor package 2003 taken along line I-I' in FIG. 2.

Referring to FIG. 3, in the semiconductor package 2003, the package substrate 2100 thereof may be a printed circuit board. The package substrate 2100 may include a package substrate body 2120, package upper pads 2130 disposed at a top surface of the package substrate body 2120, lower pads 2125 disposed at a bottom surface of the package substrate body 2120 or exposed through the bottom surface of the package substrate body 2120, and inner wirings 2135 electrically interconnecting the package upper pads 2130 and the lower pads 2125 within the package substrate body 2120. The package upper pads 2130 may be electrically connected to connecting structures 2400. The lower pads 2125 may be connected to the wiring patterns 2005 of the main substrate 2010 of the electronic system 2000 through conductive connectors 2800, as shown in FIG. 2.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, memory channel structures 3220 and separation structures 3230 extending through the gate stack structure 3210, bit lines 3240 electrically connected to the memory channel structures 3220, and gate connecting wirings electrically connected to word lines ("WL" in FIG. 1) of the gate stack structure 3210.

Each of the semiconductor chips 2200 may include a through wiring 3245 electrically connected to the peripheral wirings 3110 of the first structure 3100 while extending into the second structure 3200. The through wiring 3245 may extend through the gate stack structure 3210 and may be further disposed outside the gate stack structure 3210. Each of the semiconductor chips 2200 may further include an input/output connecting pad 3265 electrically connected to the peripheral wirings 3110 of the first structure 3100 while extending into the second structure 3200, and an input/output pad 2210 electrically connected to the input/output connecting wiring 3265.

Referring to FIG. 4, in a semiconductor package 2003A, each of semiconductor chips 2200a thereof may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including a peripheral wiring 4110 and first bonding structures 4150. The second structure 4200 may include a common source line 4205, a gate stack structure 4210 between the common source line 4205 and the first structure 4100, memory channel structures 4220 and a separation structure 4230 extending through the gate stack structure 4210, and second bonding structures 4250 electrically connected to the memory channel structures 4220 and word lines of the gate stack structure 4210 ("WL" in FIG. 1), respectively. For example, the second bonding structures 4250 may be electrically connected to the memory channel structures 4220 and the word lines ("WL" in FIG. 1) through bit lines 4240 electrically connected to the memory channel structures 4220 and gate connecting wirings electrically connected to the word lines ("WL" in FIG. 1), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, for example, copper (Cu).

Each of the semiconductor chips 2200a may further include an input/output pad 2210, and an input/output connecting wiring 4265 under the input/output pad 2210. The input/output connecting wiring 4265 may be electrically connected to a part of the second bonding structures 4250.

The semiconductor chips 2200 of FIG. 3 and the semiconductor chips 2200a of FIG. 4 may be electrically interconnected by bonding wire type connecting structures 2400. Of course, in example embodiments, semiconductor chips in one semiconductor package such as the semiconductor chips 2200 of FIG. 3 and the semiconductor chips 2200a of FIG. 4 may be electrically interconnected by a connecting structure including a through-silicon via (TSV).

Figure 5A:
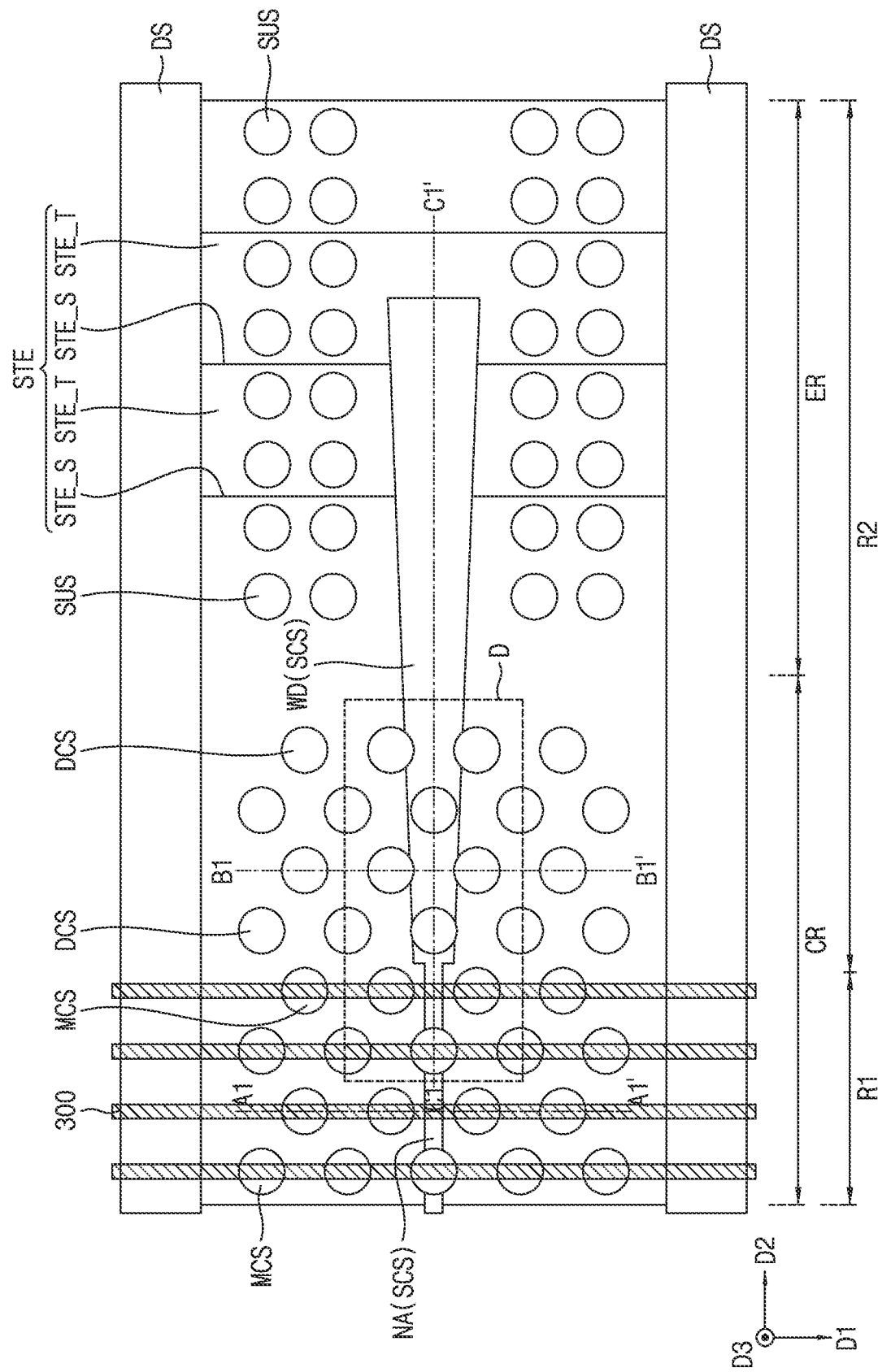
FIG. 5A is a plan view of a semiconductor device according to example embodiments of the disclosure.
Figure 5B:
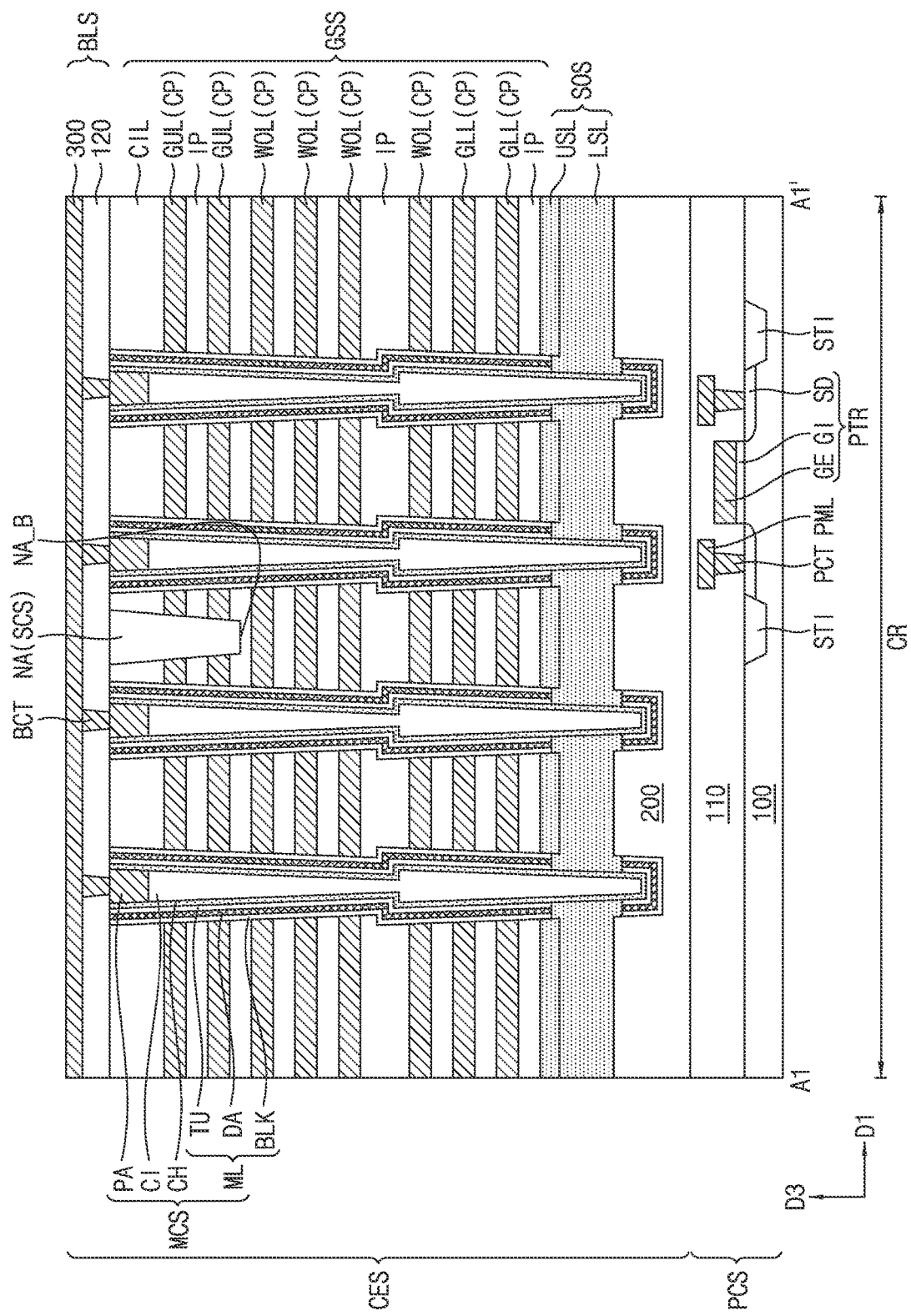
FIG. 5B is a cross-sectional view taken along line A1-A1' in FIG. 5A.
Figure 5C:
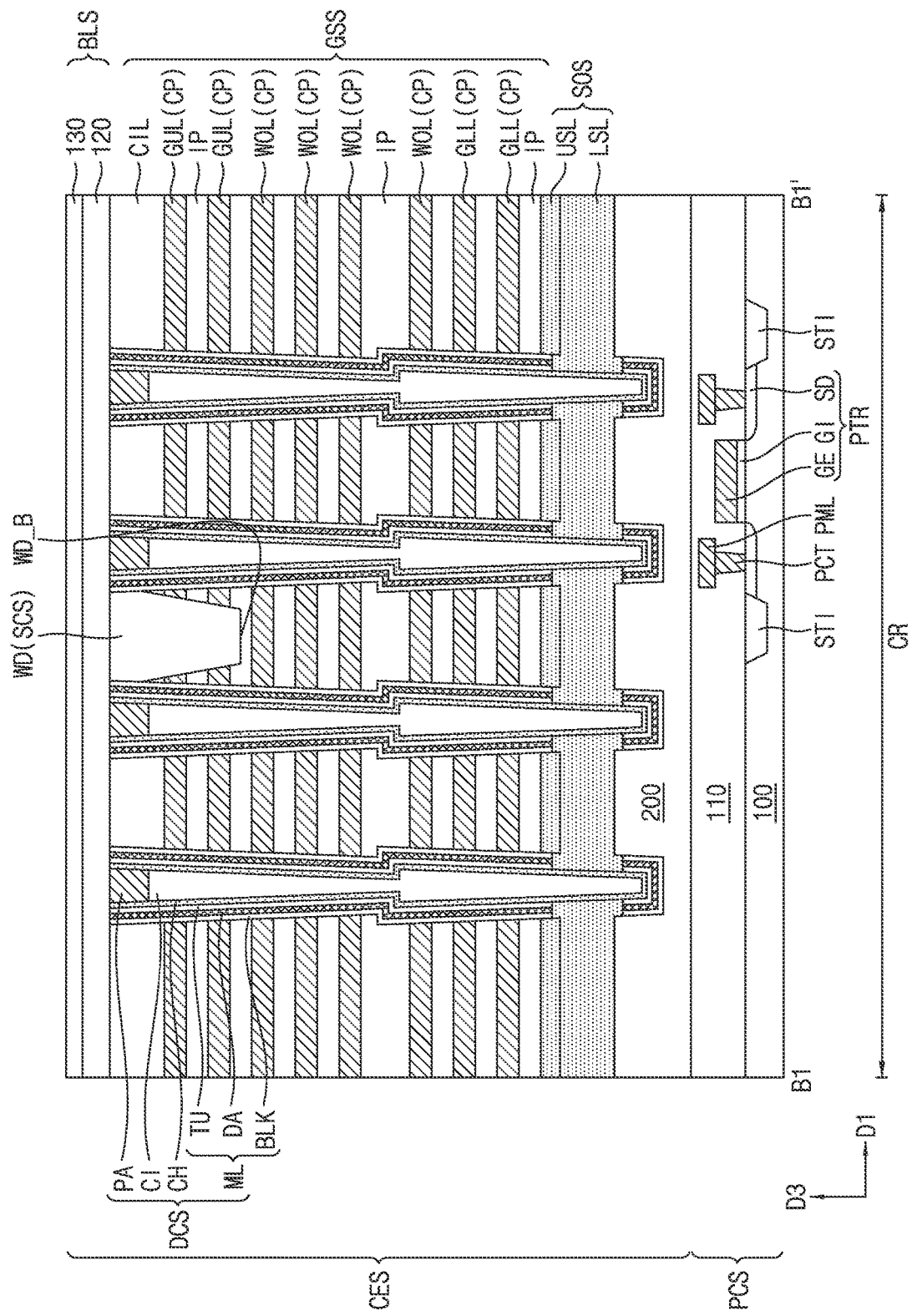
FIG. 5C is a cross-sectional view taken along line B1-B1' in FIG. 5A.
Figure 5D:
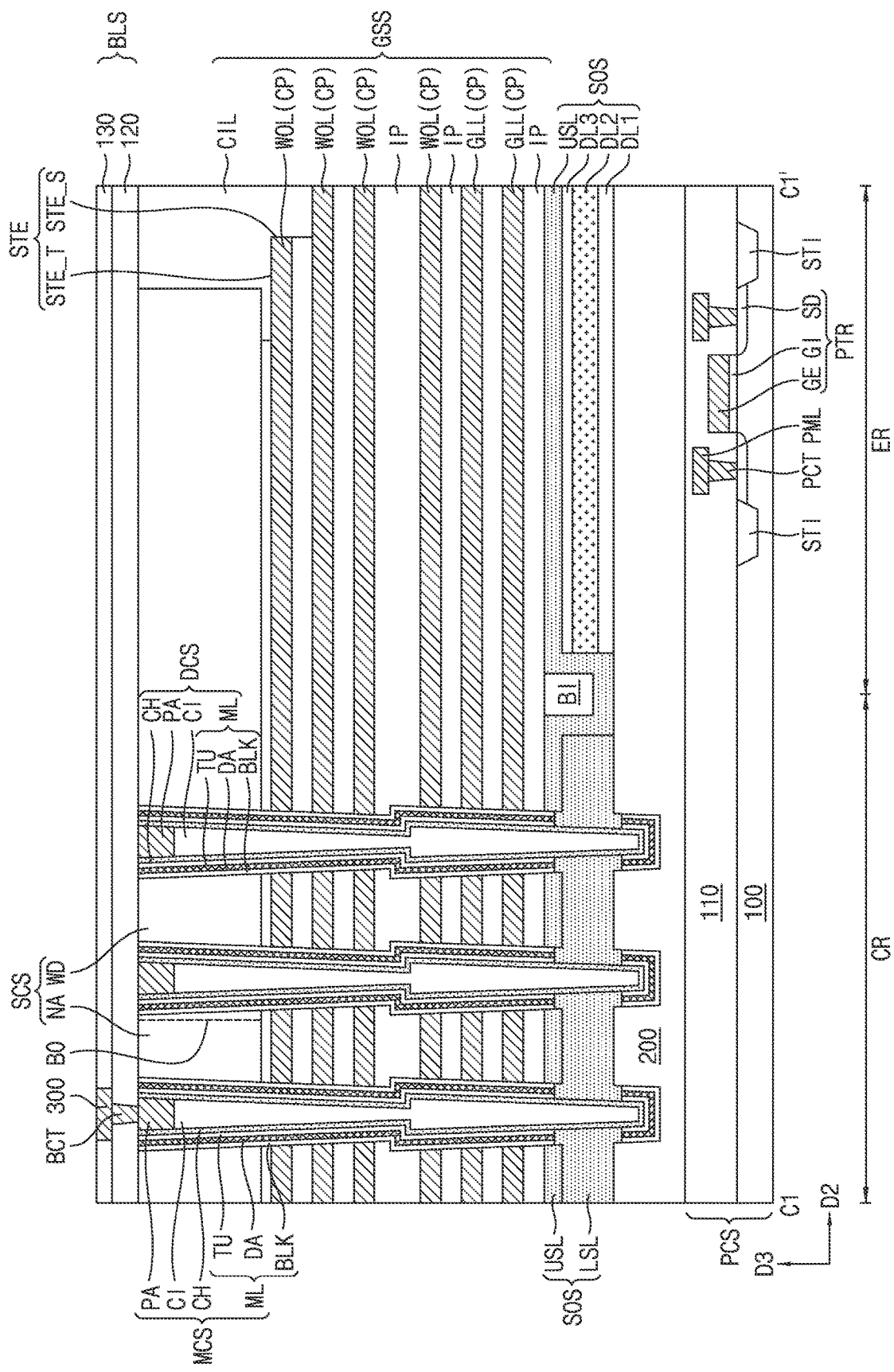
FIG. 5D is a cross-sectional view taken along line C1-C1' in FIG. 5A.
Figure 5E:
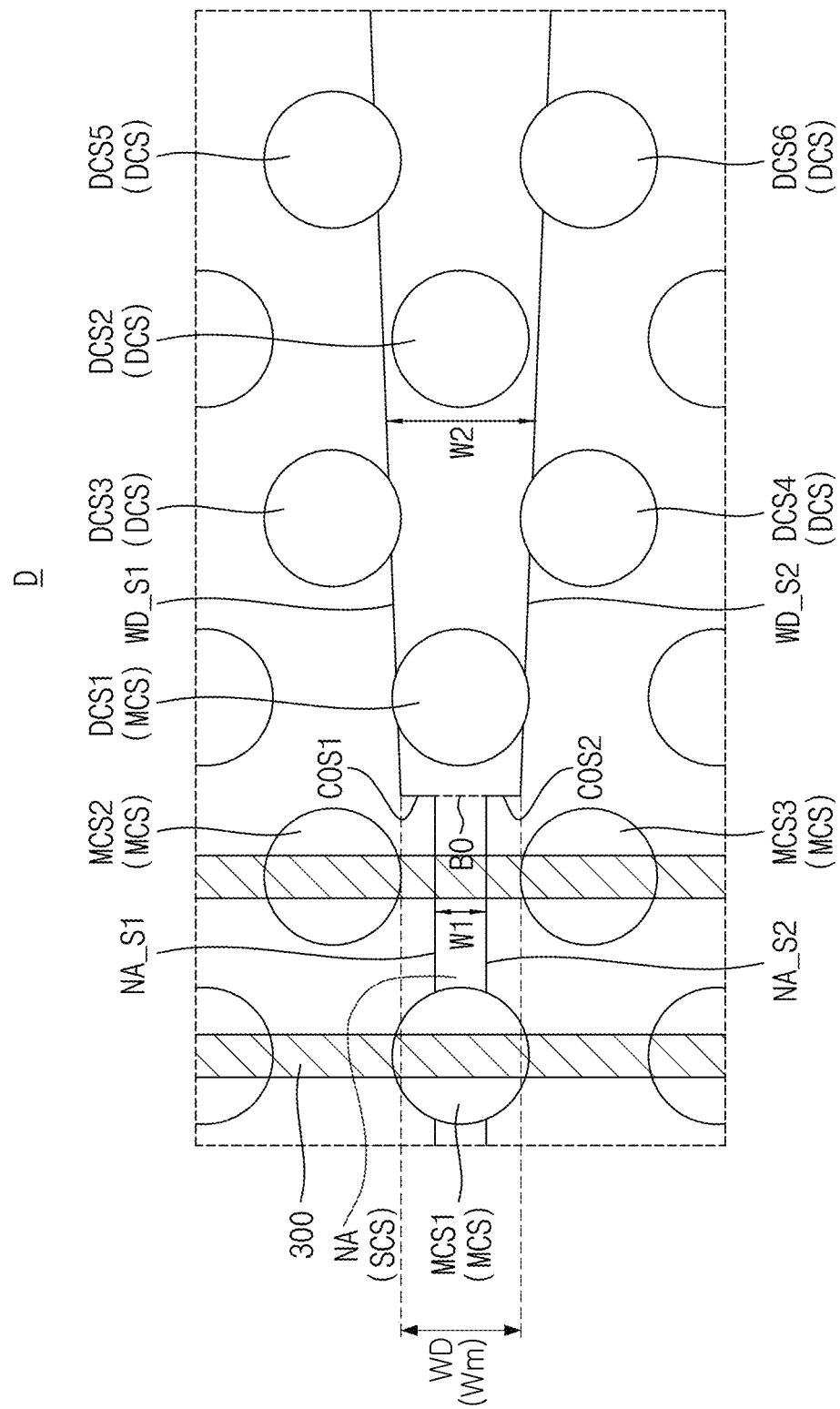
FIG. 5E is an enlarged view of a portion D of FIG. 5A.

FIG. 5A is a plan view of a semiconductor device according to example embodiments of the disclosure. FIG. 5B is a cross-sectional view taken along line A1-A1' in FIG. 5A. FIG. 5C is a cross-sectional view taken along line B1-B1' in FIG. 5A. FIG. 5D is a cross-sectional view taken along line C1-C1' in FIG. 5A. FIG. 5E is an enlarged view of a portion D of FIG. 5A.

Referring to FIGS. 5A, 5B, 5C and 5D, the semiconductor device according to the example embodiments of the disclosure may include a peripheral circuit structure PCS and a memory cell structure CES. The memory cell structure CES may be provided on the peripheral circuit structure PCS.

The semiconductor device may include a cell region CR and an extension region ER. The cell region CR and the extension region CR may be regions divided in a plane defined by a first direction D1 and a second direction D2. The first direction D1 and the second direction D2 may intersect each other. For example, the first direction D1 and the second direction D2 may perpendicularly intersect each other.

The peripheral circuit structure PCS may include a substrate 100. The substrate 100 may have the form of a plate extending along a plane defined by the first direction D1 and the second direction D2. In example embodiments, the substrate 100 may be a semiconductor substrate. For example, the substrate 100 may be a silicon substrate. In example embodiments, the substrate 100 may be a silicon-on-insulator (SOI) substrate.

The peripheral circuit structure PCS may further include a first insulating film 110 covering the substrate 100. The first insulating film 110 may cover a top surface of the substrate 100. The first insulating film 110 may include an insulating material. For example, the first insulating film 110 may include an oxide. In example embodiments, the first insulating film 110 may be a multilayer insulating film.

The peripheral circuit structure PCS may further include peripheral transistors PTR. The peripheral transistor PTR may be provided between the substrate 100 and the first insulating film 110. The peripheral transistor PTR may include source/drain regions SD, a gate electrode GE, and a gate insulating film GI. The gate electrode GE and the gate insulating film GI may be provided between the source/drain regions SD. The gate electrode GE may be spaced apart from the substrate 100 by the gate insulating film GI. The source/drain regions SD may be formed by doping the substrate 100 with impurities. The gate electrode GE may include a conductive material. The gate insulating film GI may include an insulating material.

The peripheral circuit structure PCS may further include element isolation layers STI. The element isolation layers STI may be provided in the substrate 100. The element isolation layer STI may be disposed among the peripheral transistors PTR and, as such, may electrically isolate the peripheral transistors PTR from one another. The element isolation layer STI may include an insulating material.

The peripheral circuit structure PCS may further include peripheral contacts PCT and peripheral wirings PML. The peripheral contact PCT may be connected to the peripheral transistor PTR, and the peripheral wiring PML may be connected to the peripheral contact PCT. The peripheral contact PCT and the peripheral wiring PML may be provided in the first insulating film 110. The peripheral contact PCT and the peripheral wiring PML may include a conductive material.

The memory cell structure CES may include a semiconductor layer 200, a source structure SOS, a gate stack structure GSS, memory channel structures MCS, dummy channel structures DCS, support structures SUS, and a bit line structure BLS.

The semiconductor layer 200 may be disposed on the first insulating film 110 of the peripheral circuit structure PCS. The semiconductor layer 200 may include an extrinsic semiconductor material doped with impurities and/or an intrinsic semiconductor material not doped with impurities. For example, the semiconductor layer 200 may include at least one of silicon (Si), germanium (Ge), silicon germanium (SiGe), gallium arsenide (GaAs), indium gallium arsenide (InGaAs), aluminum gallium arsenide (AlGaAs), or a mixture thereof.

The source structure SOS may be provided on the semiconductor layer 200. The source structure SOS may include a lower source film LSL, an upper source film USL, a first dummy film DL1, a second dummy film DL2, and a third dummy film DL3.

The lower source film LSL may be provided on the semiconductor layer 200. The lower source film LSL may be disposed in the cell region CR. The lower source film LSL may be a common source line. The lower source film LSL may include a conductive material. For example, the lower source film LSL may include polysilicon doped with impurities.

The first dummy film DL1, the second dummy film DL2 and the third dummy film DL3 may be sequentially provided on the semiconductor layer 200 in a third direction D3. The third direction D3 may intersect the first direction D1 and the second direction D2. For example, the third direction D3 may perpendicularly intersect the first direction D1 and the second direction D2.

The first to third dummy films DL1, DL2 and DL3 may be disposed in the extension region ER. The first to third dummy films DL1, DL2 and DL3 may be disposed at the same level as the lower source film LSL. The first to third dummy films DL1, DL2 and DL3 may include an insulating material. In example embodiments, the first and third dummy films DL1 and DL3 may include the same insulating material, and the second dummy film DL2 may include an insulating material different from that of the first and third dummy films DL1 and DL3. For example, the second dummy film DL2 may include silicon nitride, and the first and third dummy films DL1 and DL3 may include silicon oxide.

The upper source film USL may cover the lower source film LSL and the first to third dummy films DL1, DL2 and DL3. The upper source film USL may extend from the cell region CR to the extension region ER. The upper source film USL may include a semiconductor material. For example, the upper source film USL may include polysilicon doped with impurities or polysilicon not doped with impurities.

In example embodiments, the source structure SOS may further include a buried insulating film BI on the upper source film USL. The buried insulating film BI may be provided between the cell region CR and the extension region ER. The buried insulating film BI may be provided between the lower source film LSL and the first to third dummy films DL1, DL2 and DL3. The lower source film LSL and the first to third dummy films DL1, DL2 and DL3 may be spaced apart from each other in the second direction D2 under the condition that the buried insulating film BI and a portion of the upper source film USL surrounding the buried insulating film BI are interposed therebetween. The buried insulating film BI may extend in the first direction D1. The buried insulating film BI may include an insulating material.

The gate stack structure GSS may be provided on the source structure SOS. The gate stack structure GSS may include insulating patterns IP and conductive patterns CP alternately stacked in the third direction D3. The insulating patterns IP may include an insulating material. For example, the insulating patterns IP may include an oxide. The conductive patterns CP may include a conductive material.

The conductive patterns CP may include gate lower lines GLL, word lines WOL, and gate upper lines GUL. A part, adjacent to the source structure SOS, of the conductive patterns CP may be the gate lower lines GLL. A part, adjacent to the bit line structure BLS, of the conductive patterns CP may be the gate upper lines GUL. A part, disposed between the gate upper lines GUL and the gate lower lines GLL, of the conductive patterns CP may be the word lines WOL. The numbers of the gate lower lines GLL, the gate upper lines GUL and the word lines WOL are not limited to the shown numbers.

In example embodiments, a lowermost one of the insulating patterns IP may be integrally coupled to a buried insulating film BIL.

The gate stack structure GSS may further include a staircase structure STE. The staircase structure STE may be disposed in the extension region ER. The insulating patterns IP and the conductive patterns CP are configured in the form of steps and, as such, the staircase structure STE may be defined. A surface of the staircase structure STE may include step side walls STE_S and step top surfaces STE_T. The step side wall STE_S may be defined by a side wall of the insulating pattern IP and a side wall of the conductive pattern CP which are coplanar with each other. A portion, not covered by the insulating pattern IP, of a top surface of the conductive pattern CP may be defined as the step top surface STE_T. The step side wall STE_S and the step top surface STE_T may be connected to each other. The step side walls STE_S may have levels gradually lowered as the step side walls STE_S are disposed at positions farther from the cell region CR, respectively. The step top surfaces STE_T may have levels gradually lowered as the step top surfaces STE_T are disposed at positions farther from the cell region CR, respectively.

The gate stack structure GSS may further include a cover insulating film CIL. The cover insulating film CIL may cover the staircase structure STE. The cover insulating film CIL may cover the step side walls STE_S and the step top surfaces STE_T of the staircase structure STE. The cover insulating film CIL may cover a top surface of the uppermost conductive pattern CP. The cover insulating film CIL may include an insulating material. For example, the cover insulating film CIL may include an oxide.

The memory channel structures MCS may be disposed in the cell region CR. The memory cell structures MCS may extend in the third direction D3 and, as such, may extend through the cover insulating film CIL, the conductive patterns CP and the insulating patterns IP of the gate stack structure GSS and the upper source film USL and the lower source film LSL of the source structure SOS. The memory channel structures MCS may be surrounded by the insulating patterns IP and the conductive patterns CP of the gate stack structure GSS. A lowermost portion of the memory channel structure MCS may be disposed in the semiconductor layer 200.

Each of the memory channel structures MCS may include a core insulating film CI, a pad PA, a channel film CH, and a memory film ML. The core insulating film CI may extend in the third direction D3 and, as such, may extend through the conductive patterns CP and the insulating patterns IP of the gate stack structure GSS and the upper source film USL and the lower source film LSL of the source structure SOS. The core insulating film CI may include an insulating material. For example, the core insulating film CI may include an oxide.

The pad PA may be provided on the core insulating film CI. The pad PA may include a conductive material.

The channel film CH may surround the core insulating film CI and the pad PA. The channel film CH may extend in the third direction D3 and, as such, may extend through the conductive patterns CP and the insulating patterns IP of the gate stack structure GSS and the upper source film USL and the lower source film LSL of the source structure SOS. The channel film CH may cover a side wall and a bottom surface of the core insulating film CI. The channel film CH may contact the lower source film LSL of the source structure SOS. The memory channel structure MCS may be electrically connected to the source structure SOS. The channel film CH of the memory channel structure MCS may be electrically connected to the lower source film LSL of the source structure SOS. The channel film CH may include a semiconductor material. For example, the channel film CH may include polysilicon.

The memory film ML may surround the channel film CH. The memory film ML may extend in the third direction D3 and, as such, may extend through the conductive patterns CP and the insulating patterns IP of the gate stack structure GSS. The memory film ML may be surrounded by the conductive patterns CP and the insulating patterns IP of the gate stack structure GSS.

The memory film ML may include a tunnel insulating film TU surrounding the channel film CH, a charge storage film DA surrounding the tunnel insulating film TU, and a blocking film BLK surrounding the charge storage film DA. Each of the tunnel insulating film TU, the charge storage film DA and the blocking film BLK may extend through the conductive patterns CP and the insulating patterns IP of the gate stack structure GSS. The lower source film LSL of the source structure SOS may be connected to the channel film CH while extending through the tunnel insulating film TU, the charge storage film DA and the blocking film BLK of the memory film ML. The tunnel insulating film TU may include a material allowing tunneling of a charge therethrough. For example, the tunnel insulating film TU may include silicon oxide. The charge storage film DA may include a material capable of storing a charge therein. For example, the charge storage film DA may include silicon nitride. The blocking film BLK may include a material capable of preventing movement of a charge therethrough. For example, the blocking film BLK may include silicon oxide.

The dummy channel structures DCS may be disposed in the cell region CR. The dummy channel structures DCS may extend in the third direction D3 and, as such, may extend through the cover insulating film CIL, the conductive patterns CP and the insulating patterns IP of the gate stack structure GSS and the upper source film USL and the lower source film LSL of the source structure SOS. The dummy channel structures DCS may be disposed nearer to the extension region ER than the memory channel structures MCS. The dummy channel structures DCS may be disposed nearer to the staircase structure STE than the memory channel structures MCS. The memory channel structure MCS may overlap with a bit line 300, which will be described later, and the dummy channel structures DCS may not overlap with the bit line 300, which will be described later.

Each of the dummy channel structures DCS may include a core insulating film CI, a pad PA, a channel film CH, and a memory film ML. The core insulating film CI, the pad PA, the channel film CH and the memory film ML of the dummy channel structure DCS may be similar to the core insulating film CI, the pad PA, the channel film CH and the memory film ML of the memory channel structure MCS. The memory film ML of the dummy channel structure DCS may include a tunnel insulating film TU, a charge storage film DA, and a blocking film BLK, similarly to the memory film ML of the memory channel structure MCS.

The support structures SUS may be disposed in the extension region ER. The support structures SUS may extend in the third direction D3 and, as such, may extend through the cover insulating film CIL, the conductive patterns CP and the insulating patterns IP of the gate stack structure GSS and the upper source film USL and the first to third dummy films DL1, DL2 and DL3 of the source structure SOS. At least one of the support structures SUS may extend through the step top surface STE_T of the staircase structure STE. The support structures SUS may be surrounded by the conductive patterns CP and the insulating patterns IP of the gate stack structure GSS. A lowermost portion of the support structure SUS may be disposed in the semiconductor layer 200. The support structures SUS may support the gate stack structure GSS in the extension region ER.

The memory cell structure CES may further include a cut structure SCS. The cut structure SCS may extend from the cell region CR to the extension region ER. The cut structure SCS may extend in the second direction D2. The cut structure SCS may extend through the gate upper lines GUL. The cut structure SCS may extend through a part of the insulting patterns IP. A lowermost portion of the cut structure SCS may be disposed at a higher level than the uppermost word line WOL. The lowermost portion of the cut structure SCS may be disposed in the insulating pattern IP covering a top surface of the uppermost word line WOL. The cut structure SCS may include an insulating material. For example, the cut structure SCS may include an oxide.

The cut structure SCS may include a narrow section NA and a wide section WD. The narrow section NA may be a portion adjacent to the memory channel structures MCS. The wide section WD may be a portion adjacent to the dummy channel structures DCS and the support structure SUS. The wide section WD may be disposed nearer to the staircase structure STE than the narrow section NA. That is, a distance between the wide section WD and the staircase structure STE is less than a distance between the narrow section NA and the staircase structure STE. The wide section WD may be disposed nearer to the support structure SUS than the narrow section NA. That is, a distance between the wide section WD and the support structure SUS is less than a distance between the narrow section NA and the support structure SUS. The narrow section NA may be disposed between the memory channel structures MCS. The wide section WD may be disposed between the dummy channel structures DCS and between the support structures SUS. The narrow section NA may be disposed in a first region R1 where the memory channel structures MCS are disposed, and the wide section WD may be disposed in a second region R2 where the dummy channel structures DCS, the support structures SUS and the staircase structures STE are disposed. The narrow section NA may be disposed in the cell region CR. The wide section WD may extend from the cell region CR to the extension region ER.

In example embodiments, the level of a bottom surface WD_B of the wide section WD may be equal to the level of a bottom surface NA_B of the narrow section NA. That is, the depth of the wide section WD and the depth of the narrow section NA may be equal. In example embodiments, the level of the bottom surface WD_B of the wide section WD may be lower than the level of the bottom surface NA_B of the narrow section NA. That is, the depth of the wide section WD may be greater than the depth of the narrow section NA.

The narrow section NA and the wide section WD of the cut structure SCS will be described in detail later.

The memory cell structure CES may further include separation structures DS. The separation structures DS may extend in the second direction D2. The separation structures DS may extend through the conductive patterns CP and the insulating patterns IP of the gate stack structure GSS. The memory channel structures MCS, the dummy channel structures DCS, the support structures SUS, and the cut structure SCS may be disposed between the separation structures DS. In example embodiments, the separation structure DS may include an insulating material.

The bit line structure BLS may be provided on the gate stack structure GSS. The bit line structure BLS may include a second insulating film 120, bit line contacts BCT, a third insulating film 130, and bit lines 300.

The second insulating film 120 may cover the gate stack structure GSS, the memory channel structures MCS, the dummy channel structures DCS, the support structures SUS and the cut structure SCS. The second insulating film 120 may include an insulating material.

The bit line contacts BCT may be provided in the second insulating film 120. The bit line contact BCT may contact the pad PA of the memory channel structure MCS while extending through the second insulating film 120. The dummy channel structures DCS may not contact the bit line contact BCT. The bit line contacts BCT may include a conductive material.

The third insulating film 130, which covers the second insulating film 120 and the bit line contacts BCT, may be provided. The third insulating film 130 may include an insulating material.

The bit lines 300 may be provided in the third insulating film 130. The bit lines 300 may extend in the first direction D1. The bit lines 300 may be spaced apart from one another in the second direction D2. The bit line 300 may be electrically connected to the memory channel structure MCS via the bit line contact BCT. The bit line 300 may include a conductive material.

Referring to FIG. 5E, a boundary BO between the narrow section NA and the wide section WD may be disposed between the memory channel structures MCS and the dummy channel structures DCS. The boundary BO between the narrow section NA and the wide section WD may be disposed between the memory channel structure MCS disposed nearest to the dummy channel structures DCS and the dummy channel structure DCS disposed nearest to the memory channel structures MCS. In example embodiments, the boundary BO between the narrow section NA and the wide section WD may be disposed between the dummy channel structures DCS.

The width of the narrow section NA in the first direction D1 may be defined as a first width W1. The width of the wide section WD in the first direction D1 may be defined as a second width W2. The width of the narrow section NA may be less than the width of the wide section WD. For example, the first width W1 may be less than the second width W2. The width of the narrow section NA may be constant. For example, the first width W1 may be constant. The width of the wide section WD may be gradually increased as the wide section WD extends away from the narrow section NA. For example, the second width W2 may be gradually increased as the wide section WD extends away from the narrow section NA. The width of the wide section WD may be gradually increased as the wide section WD extends toward the staircase structure STE. The width of the wide section WD may be gradually increased as the wide section WD extends toward the support structure SUS. The width of the wide section WD may be gradually increased as the wide section WD extends away from the memory channel structures MCS. The width of the wide section WD may be gradually increased as the wide section WD extends from the cell region CR to the extension region ER.

The maximum width of the narrow section NA may be less than the minimum width of the wide section WD. For example, the maximum value of the first width W1 may be less than the minimum value of the second width W2. In example embodiments, the first width W1 may be 70 to 90 nm, and the second width W2 may be 110 to 130 nm. In example embodiments, the minimum width WD(Wm) of the wide section WD is at least 110 to 130 nm.

The narrow section NA may include a first side wall NA_S1 and a second side wall NA_S2. The first side wall NA_S1 and the second side wall NA_S2 of the narrow section NA may extend in the second direction D2. The distance between the first and second side walls NA_S1 and NA_S2 of the narrow section NA may be constant. The wide section WD may include a first side wall WD_S1 and a second side wall WD_S2. The first and second side walls WD_S1 and WD_S2 of the wide section WD may have an inclination with respect to the second direction D2. The distance between the first and second side walls WD_S1 and WD_S2 of the wide section WD may be gradually increased as the wide section WD extends away from the narrow section NA.

The wide section WD may include a first connecting surface COS1 and a second connecting surface COS2. The first connecting surface COS1 may interconnect the first side wall WD_S1 of the wide section WD and the first side wall NA_S1 of the narrow section NA. The first connecting surface COS1 may intersect the first side wall WD_S1 of the wide section WD and the first side wall NA_S1 of the narrow section NA. The second connecting surface COS2 may interconnect the second side wall WD_S2 of the wide section WD and the second side wall NA_S2 of the narrow section NA. The second connecting surface COS2 may intersect the second side wall WD_S2 of the wide section WD and the second side wall NA_S2 of the narrow section NA. The first and second connecting surfaces COS1 and COS2 may intersect each other in the second direction D2. The first and second connecting surfaces COS1 and COS2 may be disposed between the memory channel structures MCS and the dummy channel structures DCS. The boundary BO between the narrow section NA and the wide section WD may be defined between the first and second connecting surfaces COS1 and COS2.

At least one of the memory channel structures MCS may contact the narrow section NA of the cut structure SCS. For example, a first memory channel structure MCS1 from among the memory channel structures MCS may contact the narrow section NA. A second memory channel structure MCS2 adjacent to the first memory channel structure MCS1 in a fourth direction D4 may be defined. The fourth direction D4 may intersect the first and second directions D1 and D2. The fourth direction D4 may perpendicularly intersect the third direction D3. A third memory channel structure MCS3 adjacent to the first memory channel structure MCS1 in a fifth direction D5 may be defined. The fifth direction D5 may intersect the first, second and fourth directions D1, D2 and D4. The fifth direction D5 may perpendicularly intersect the third direction D3. The second and third memory channel structures MCS2 and MCS3 may be spaced apart from the narrow section NA.

At least one of the dummy channel structures DCS may overlap with the first memory channel structure MCS1 in the second direction D2. First and second dummy channel structures DCS1 and DCS2, which overlap with the first memory channel structure MCS1 in the second direction D2, may be defined. All of the first memory channel structure MCS1, the first dummy channel structure DCS1 and the second dummy channel structure DCS2 may be disposed on a line extending in the second direction D2.

The first and second channel structures DCS1 and DCS2 may contact the wide section WD. The first dummy channel structure DCS1 may be disposed nearer to the narrow section NA than the second dummy channel structure DCS2. The first dummy channel structure DCS1 may extend through the first side wall WD_S1 and the second side wall WD_S2 of the wide section WD. The second dummy channel structure DCS2 may be surrounded by the wide section WD. A third dummy channel structure DCS3 adjacent to the first dummy channel structure DCS1 in the fourth direction D4 may be defined, a fourth dummy channel structure DCS4 adjacent to the first dummy channel structure DCS1 in the fifth direction D5 may be defined, a fifth dummy channel structure DCS5 adjacent to the second dummy channel structure DCS2 in the fourth direction D4 may be defined, and a sixth dummy channel structure DCS6 adjacent to the second dummy channel structure DCS2 in the fifth direction D5 may be defined. The third to sixth dummy channel structures DCS3, DCS4, DCS5 and DCS6 may contact the wide section WD. The third and fifth dummy channel structures DCS3 and DCS5 may extend through the first side wall WD_S1 of the wide section WD. The fourth and sixth dummy channel structures DCS4 and DCS6 may extend through the second side wall WD_S2 of the wide section WD.

Structures of the wide section WD of the cut structure SCS and the dummy channel structures DCS are not limited to the structures shown in FIG. 5E. In example embodiments, the first dummy channel structure DCS1 may be surrounded by the wide section WD. In example embodiments, the third to sixth dummy channel structures DCS3, DCS4, DCS5 and DCS6 may be spaced apart from the wide section WD. In example embodiments, the second dummy channel structure DCS2 may extend through the first and second side walls WD_S1 and WD_S2 of the wide section WD.

Figure 6:
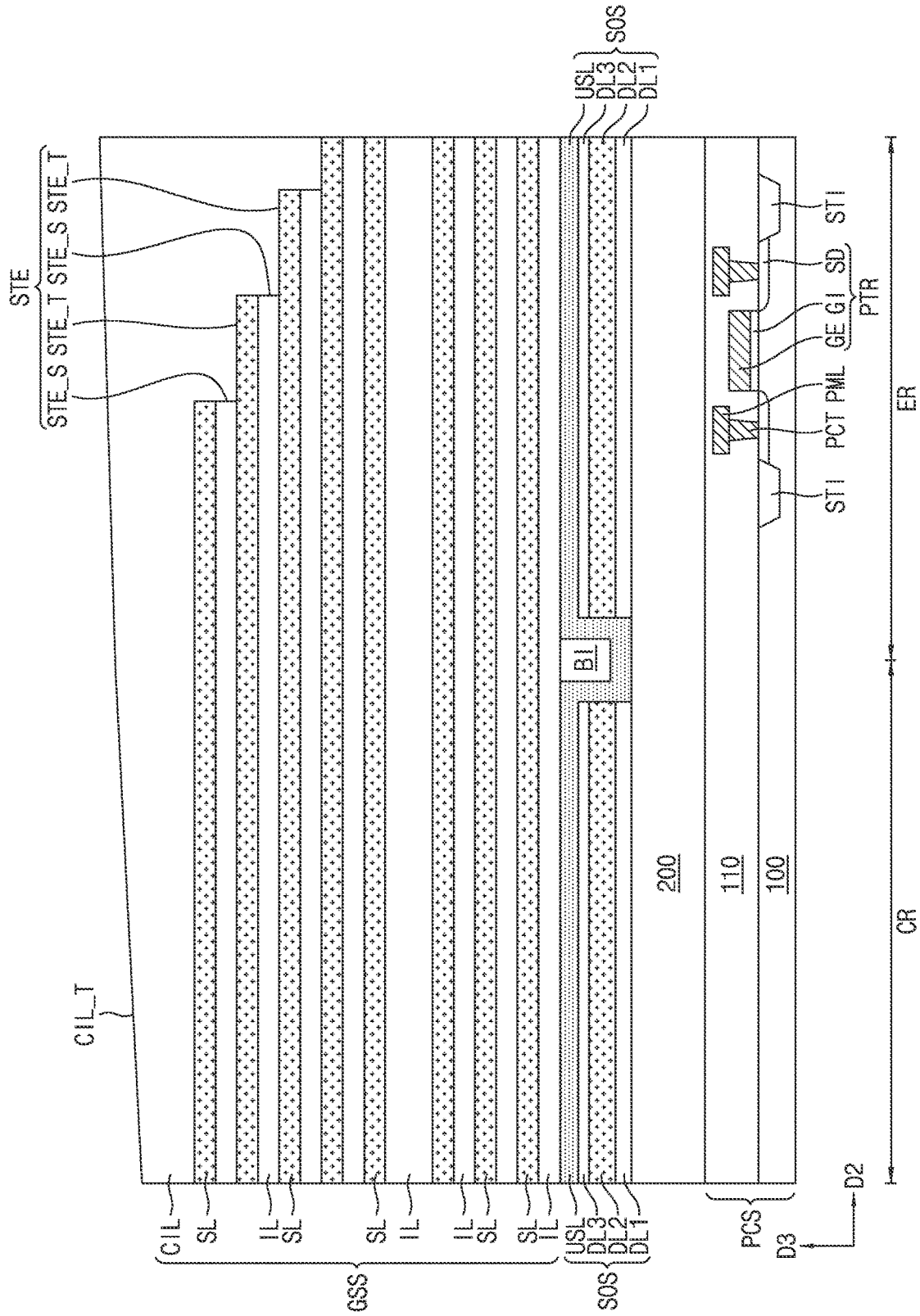
FIGS. 6 and 7A are views explaining a semiconductor device manufacturing method according to example embodiments of the disclosure.
Figure 7A:
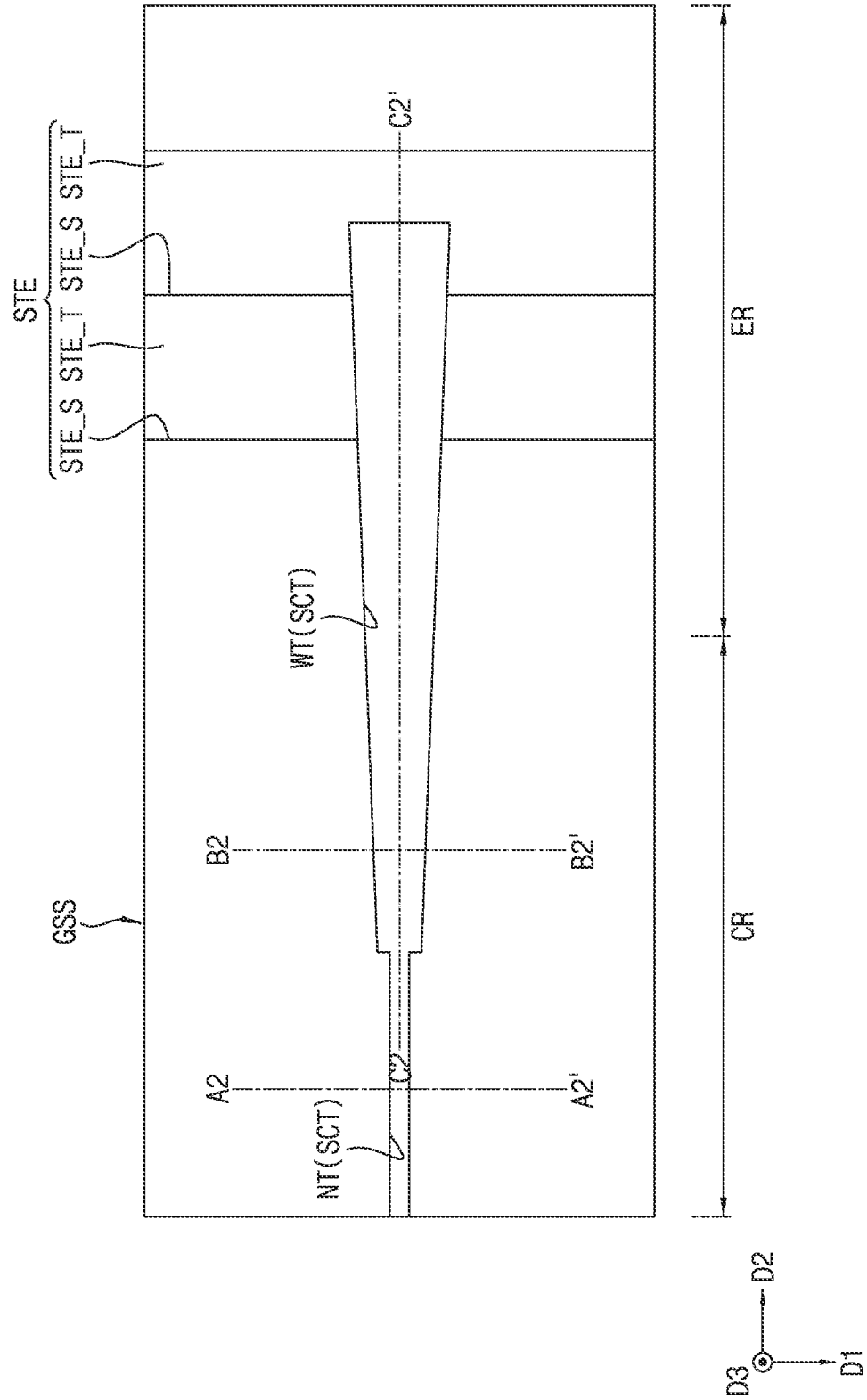
Figure 7B:
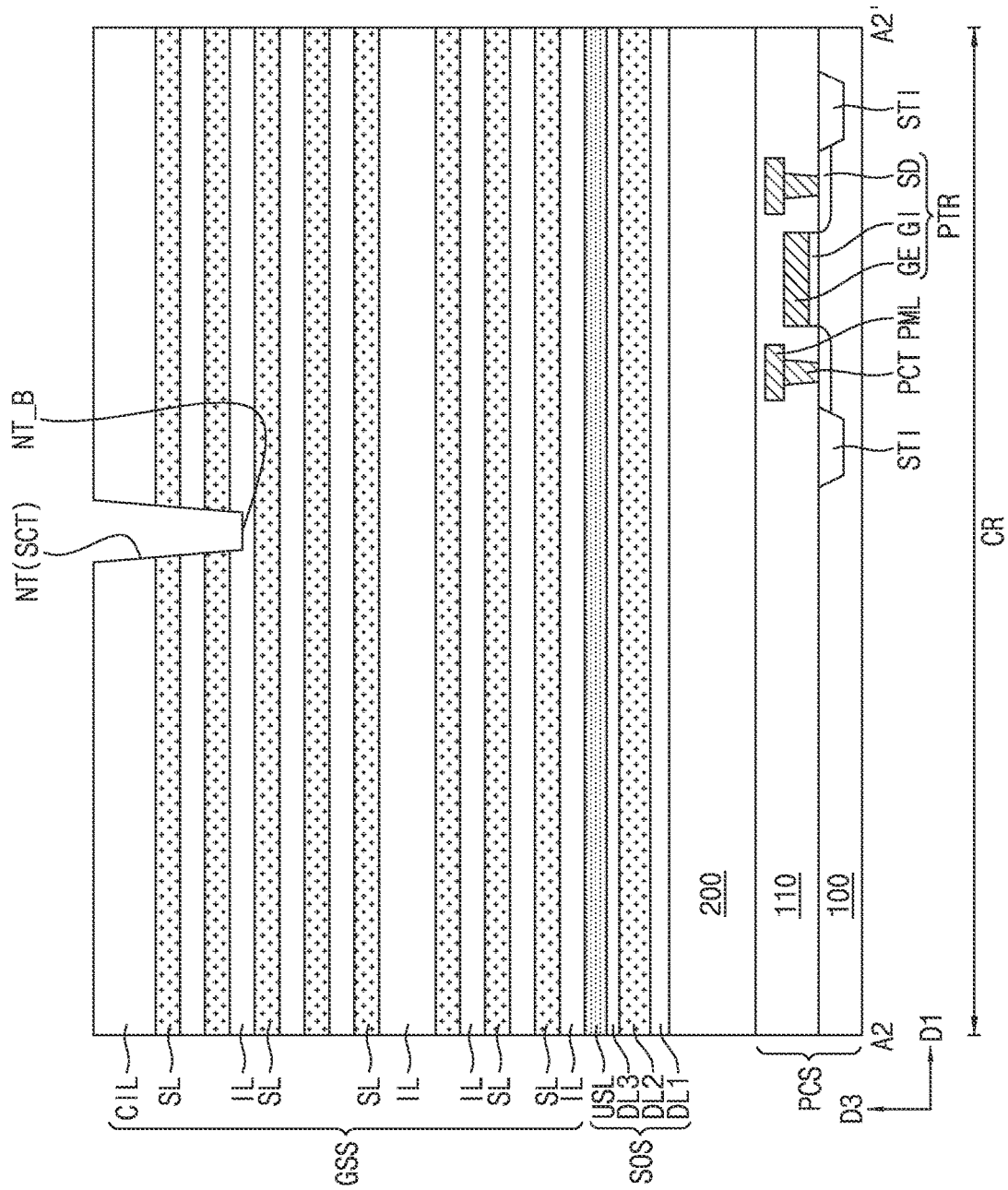
FIG. 7B is a cross-sectional view taken along line A2-A2' in FIG. 7A.
Figure 7C:
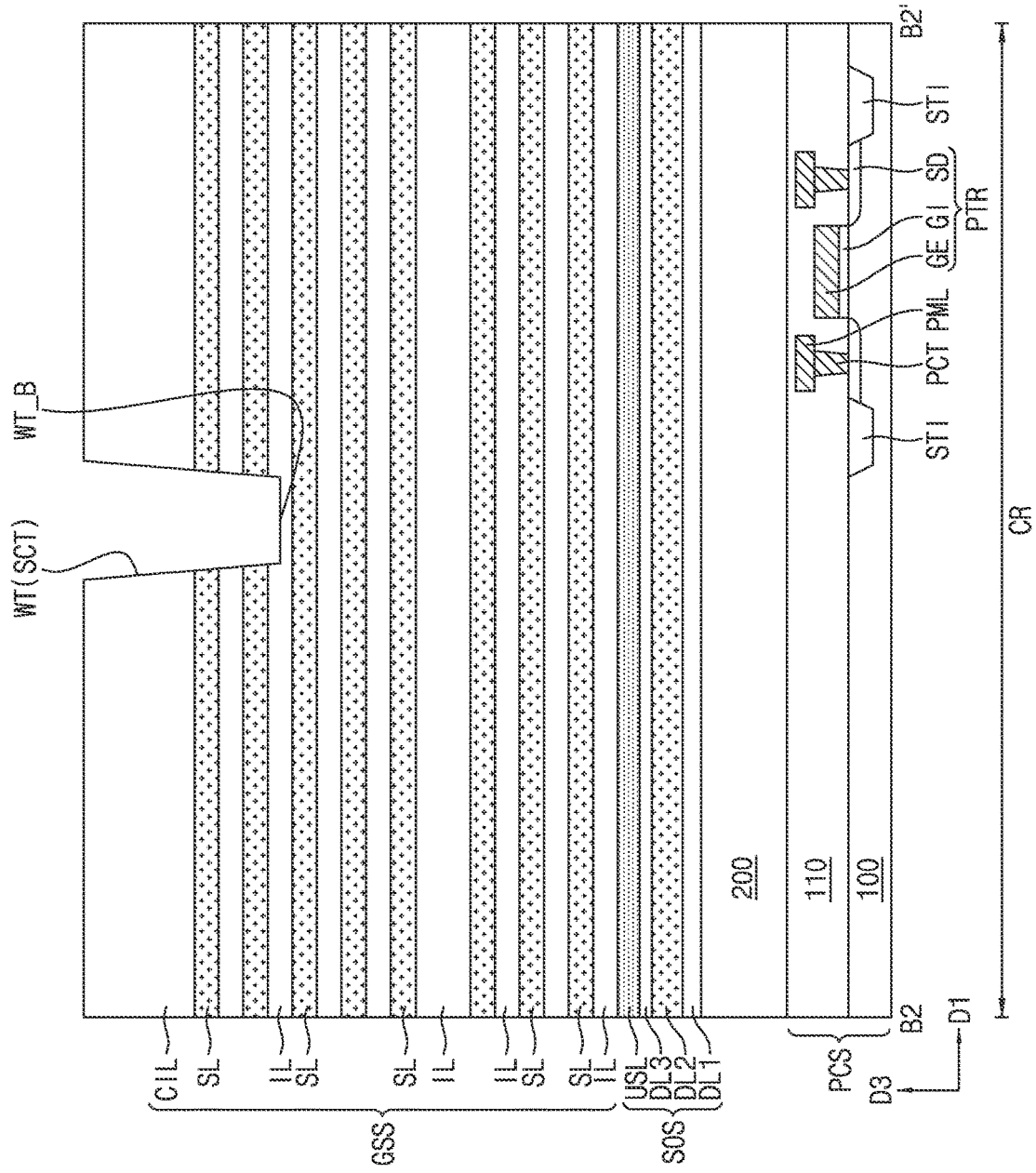
FIG. 7C is a cross-sectional view taken along line B2-B2' in FIG. 7A.
Figure 7D:
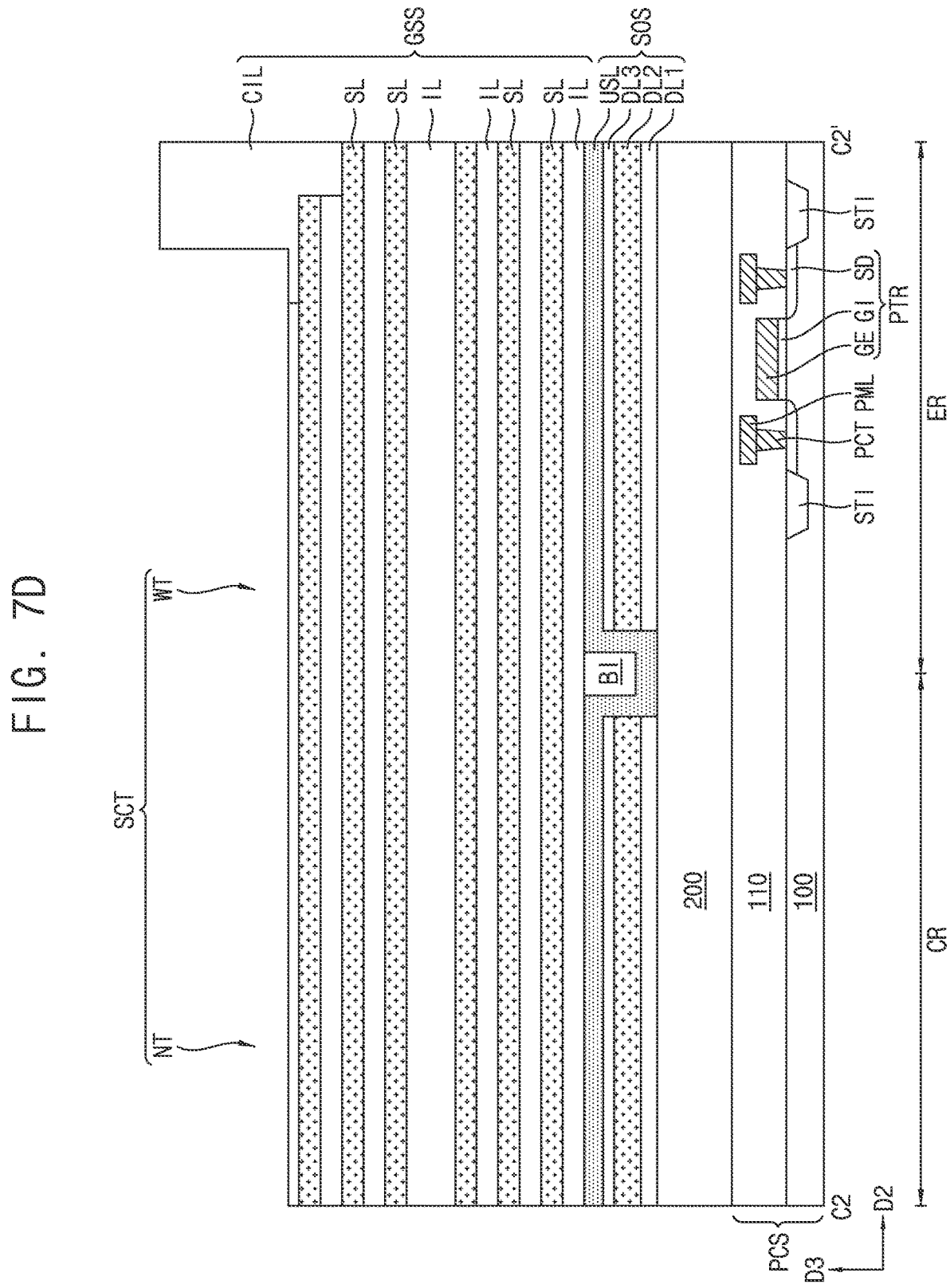
FIG. 7D is a cross-sectional view taken along line C2-C2' in FIG. 7A.

FIGS. 6 and 7A are views explaining a semiconductor device manufacturing method according to example embodiments of the disclosure. FIG. 7B is a cross-sectional view taken along line A2-A2' in FIG. 7A. FIG. 7C is a cross-sectional view taken along line B2-B2' in FIG. 7A. FIG. 7D is a cross-sectional view taken along line C2-C2' in FIG. 7A.

Referring to FIG. 6, a peripheral circuit structure PCS may be formed. Formation of the peripheral circuit structure PCS may include forming, on a substrate 100, peripheral transistors PTR, element isolation layers STI, peripheral contacts PCT, peripheral wirings PML, and a first insulating film 110.

A semiconductor layer 200 may be formed on the peripheral circuit structure PCS.

A source structure SOS may be formed on the semiconductor layer 200. The source structure SOS may include first to third dummy films DL1, DL2 and DL3 in a cell region CR, first to third dummy films DL1, DL2 and DL3 in an extension region ER, an upper source film USL covering the first to third dummy films DL1, DL2 and DL3, and a buried insulating film BI on the upper source film USL.

In example embodiments, before formation of the upper source film USL, a process for separating the first to third dummy films DL1, DL2 and DL3 in the cell region CR and the first to third dummy films DL1, DL2 and DL3 in the extension region ER from each other may be performed. In example embodiments, the buried insulating film BI may be formed simultaneously with a lowermost one of stack insulating films IL, which will be described later.

A gate stack structure GSS including the stack insulating films IL and stack sacrificial films SL may be formed. The gate stack structure GSS may be formed by alternately stacking the stack insulating films IL and the stack sacrificial films SL in a third direction D3. The stack insulating film IL and the stack sacrificial film SL may include materials having etch selectivity with respect to each other, respectively. For example, the stack sacrificial film SL may include a nitride, and the stack insulating film IL may include an oxide.

A staircase structure STE may be formed at the gate stack structure GSS. Formation of the staircase structure STE may include etching the stack sacrificial films SL and the stack insulating films IL to have a staircase shape.

A cover insulating film CIL may be formed. The cover insulating film CIL may cover the staircase structure STE. The cover insulating film CIL may cover step top surfaces STE_T and step side walls STE_S of the staircase structure STE. The cover insulating film CIL may cover a top surface of an uppermost one of the stack sacrificial films SL.

The level of a top surface CIL_T of the cover insulating film CIL may be gradually raised as the cover insulating film CIL extends from the cell region CR to the extension region ER. The level of the top surface CIL_T of the cover insulating film CIL may be gradually raised as the cover insulating film CIL extends toward the staircase structure STE. The thickness of the cover insulating film CIL (that is, the width in the third direction D3) may be gradually increased as the cover insulating film CIL extends from the cell region CR to the extension region ER.

Referring to FIGS. 7A, 7B, 7C and 7D, a cut trench SCT may be formed. The cut trench SCT may be formed by etching the cover insulating film CIL, a part of the stack sacrificial films SL, and a part of the stack insulating films IL. The cut trench SCT may extend through the cover insulating film CIL. The cut trench SCT may extend through the uppermost stack sacrificial film SL. The width of the cut trench SCT may be gradually increased as the cut trench SCT extends toward the staircase structure STE. The width of the cut trench SCT may be gradually increased as the cut trench SCT extends from the cell region CR to the extension region ER.

The cut trench SCT may include a narrow trench NT and a wide trench WT connected to each other. The narrow trench NT may be formed in the cell region CR. The wide trench WT may extend from the cell region CR to the extension region ER. The wide trench WT may be disposed nearer to the staircase structure STE than the narrow trench NT.

The narrow trench NT may have a constant width. For example, the width of the narrow trench NT in a first direction D1 may be constant. The width of the wide trench WT may be gradually increased as the wide trench WT extends away from the narrow trench NT. For example, the width of the wide trench WT in the first direction D1 may be gradually increased as the wide trench WT extends away from the narrow trench NT. The width of the wide trench WT may be gradually increased as the wide trench WT extends toward the staircase structure STE. The width of the narrow trench NT may be less than the width of the wide trench WT. The maximum width of the narrow trench NT may be less than the minimum width of the wide trench WT.

In example embodiments, the level of a bottom surface WT_B of the wide trench WT may be equal to the level of a bottom surface NT_B of the narrow trench NT. That is, the depth of the wide trench WT and the depth of the narrow trench NT may be equal. In example embodiments, the level of the bottom surface WT_B of the wide trench WT may be lower than the level of the bottom surface NT_B of the narrow trench NT. That is, the depth of the wide trench WT may be greater than the depth of the narrow trench NT.

Referring to FIGS. 5A, 5B, 5C and 5D, a cut structure SCS filling the cut trench SCT may be formed. In example embodiments, formation of the cut structure SCS may include filling the cut trench SCT with an insulating material, and polishing the top surface CIL_T of the cover insulating film CIL through execution of a polishing process. A narrow section NA filling the narrow trench NT and a wide section WD filling the wide trench WT may be formed.

Memory channel structures MCS, dummy channel structure DCS, and support structures SUS may be formed. Formation of the memory channel structures MCS may include forming memory channel holes extending through the gate stack structure GSS, and forming the memory channel structures MCS in the memory channel holes, respectively. Formation of the dummy channel structures DCS may include dummy channel holes extending through the gate stack structure GSS, and forming the dummy channel structures DCS in the dummy channel holes, respectively. The stack insulating films Il, through which the memory channel holes and the dummy channel holes extend, may be defined as insulating patterns IP, and the stack sacrificial films SL, through which the memory channel holes and the dummy channel holes extend, may be defined as sacrificial patterns. In example embodiments, the memory channel holes and the dummy channel holes may be simultaneously formed, and the memory channel structures MCS and the dummy channel structures DCS may be simultaneously formed.

A part of the memory channel holes may extend through the narrow section NA of the cut structure SCS. A part of the dummy channel holes may extend through the wide section WD of the cut structure SCS. A part of the dummy channel holes may be surrounded by the wide section WD of the cut structure SCS.

A bit line structure BLS may be formed on the gate stack structure GSS.

The sacrificial patterns may be replaced by conductive patterns CP, and the first to third dummy films DL1, DL2 and DL3 in the cell region CR may be replaced by a lower source film LSL. After formation of the conductive patterns CP and the lower source film LSL, a separation structure DS may be formed.

In the semiconductor device according to the example embodiments of the disclosure, difficulties in a process of forming a memory channel hole may be alleviated because the narrow section of the cut structure has a relatively small width. In detail, difficulties in a process of forming a memory channel hole extending through the narrow section of the cut structure may be alleviated.

In the semiconductor device according to the example embodiments of the disclosure, the wide section of the cut structure may be formed to have a relatively great width and, as such, the wide section may be formed to have a desired depth even when the thickness of a cover insulating film at a position where the wide section is formed is relatively great.

FIG. 8 is a plan view of a semiconductor device according to example embodiments of the disclosure.

Referring to FIG. 8, the semiconductor device may include memory channel structures MCSa and dummy channel structures DCSa disposed in a cell region CRa, and support structures SUSa disposed in an extension region ERa.

The semiconductor device may further include a cut structure SCSa extending from the cell region CRa to the extension region ERa. The cut structure SCSa may include a narrow section NAa and a wide section WDa. The boundary between the wide section WDa and the narrow section NAa may be disposed between the memory channel structures MCSa and the dummy channel structures DCSa. The minimum width of the wide section WDa may be equal to the width of the narrow section NAa. For example, the minimum width of the wide section WDa in a first direction D1 may be equal to the width of the narrow section NAa in the first direction.

FIG. 9 is a plan view of a semiconductor device according to example embodiments of the disclosure.

Referring to FIG. 9, the semiconductor device may include memory channel structures MCSb and dummy channel structures DCSb disposed in a cell region CRb, and support structures SUSb disposed in an extension region ERb.

The semiconductor device may further include a cut structure SCSb extending from the cell region CRb to the extension region ERb. The cut structure SCSb may include a narrow section NAb and a wide section WDb. The boundary between the narrow section NAb and the wide section WDb may be disposed between the memory channel structures MCSb and the dummy channel structures DCSb. The wide section WDb and the narrow section NAb may have constant widths, respectively. For example, the widths of wide section WDb and the narrow section NAb in the first direction D1 may be constant. The width of the wide section WDb may be greater than the width of the narrow section NAb. For example, the width of the wide section WDb in the first direction D1 may be greater than the width of the narrow section NAb in the first direction D1.

Figure 10:
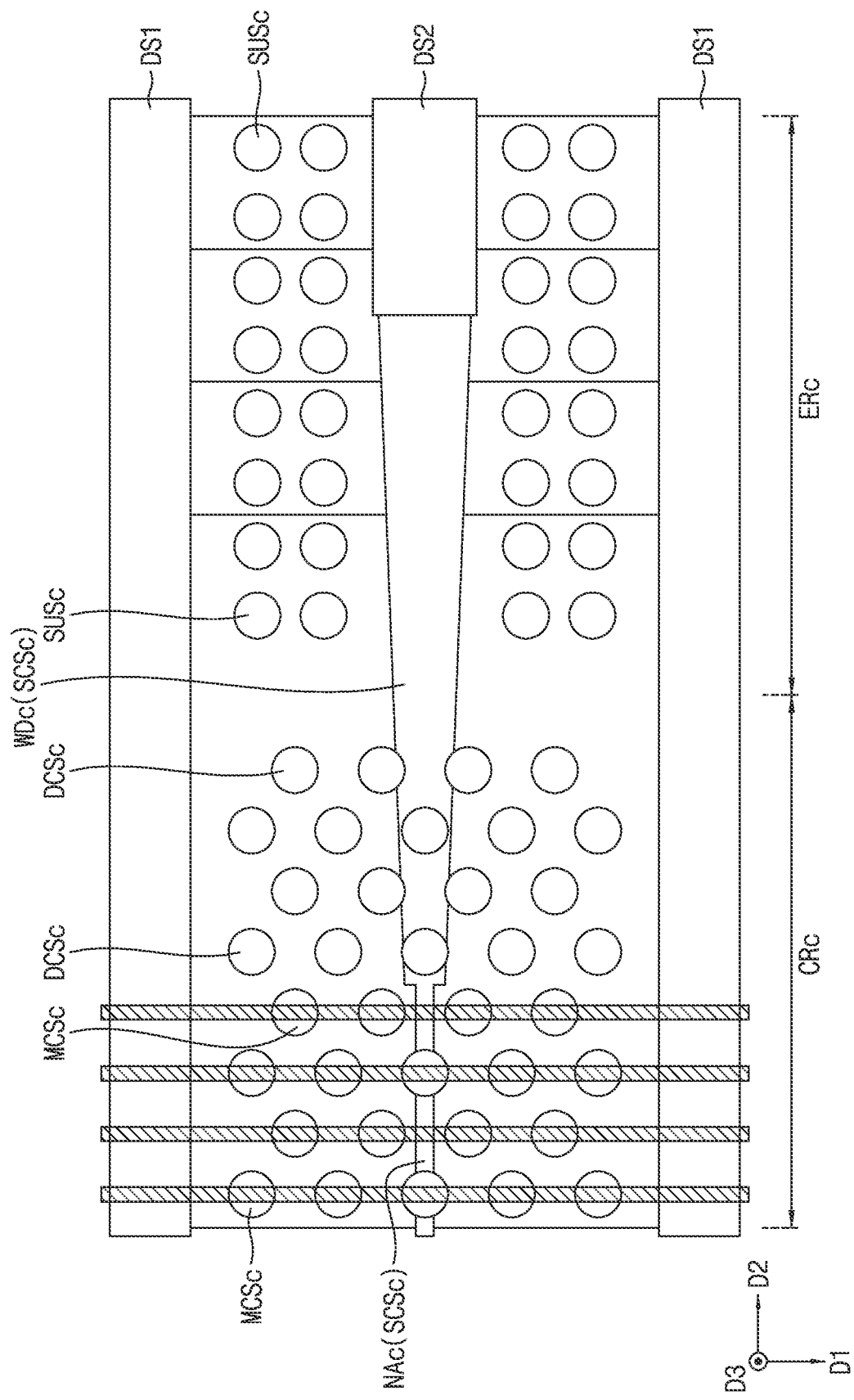
FIG. 10 is a plan view of a semiconductor device according to example embodiments of the disclosure.

FIG. 10 is a plan view of a semiconductor device according to example embodiments of the disclosure.

Referring to FIG. 10, the semiconductor device may include memory channel structures MCSc and dummy channel structures DCSc disposed in a cell region CRc, and support structures SUSc disposed in an extension region ERc.

The semiconductor device may further include a cut structure SCSc extending from the cell region CRc to the extension region ERc. The cut structure SCSc may include a narrow section NAc and a wide section WDc. The boundary between the narrow section NAc and the wide section WDc may be disposed between the memory channel structures MCSc and the dummy channel structures DCSc.

The semiconductor device may further include first separation structures DS1 and a second separation structure DS2. The first and second separation structures DS1 and DS2 may extend in a second direction D2. The first separation structures DS1 may be spaced apart from each other in a first direction D1. The memory channel structures MCSc, the dummy channel structures DCSc, the support structures SUSc, the cut structure SCSc, and the second separation structure DS2 may be disposed between the first separation structures DS1.

The second separation structure DS2 may be disposed between the support structures SUSc. The second separation structure DS2 may be connected to the wide section WDc of the cut structure SCSc. The second separation structure DS2 and the wide section WDc may be interconnected in the extension region ERc. Both the second separation structure DS2 and the cut structure SCSc may be disposed on a line extending in a second direction D2. The second separation structure DS2 and the cut structure SCSc may overlap with each other in the second direction D2. The second separation structure DS2 may contact a portion, which has a maximum width, of the wide section WDc. The width of the second separation structure DS2 may be greater than the maximum width of the wide section WDc. For example, the width of the second separation structure DS2 in the first direction D1 may be greater than the maximum width of the wide section WDc in the first direction D1.

Figure 11:
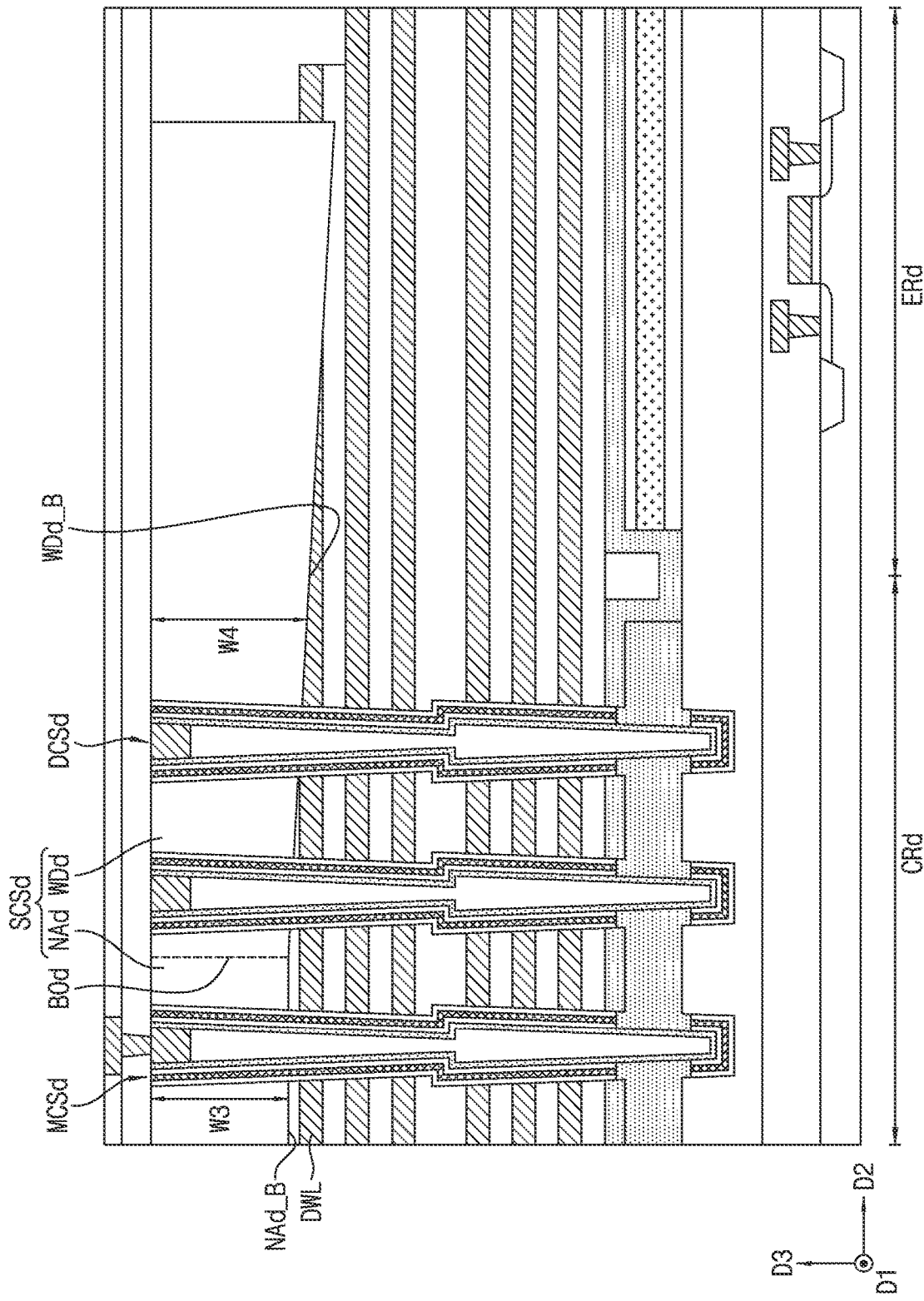
FIG. 11 is a plan view of a semiconductor device according to example embodiments of the disclosure.

FIG. 11 is a plan view of a semiconductor device according to example embodiments of the disclosure.

Referring to FIG. 11, the semiconductor device may include memory channel structures MCSd and dummy channel structures DCSd disposed in a cell region CRd.

The semiconductor device may further include a cut structure SCSd extending from the cell region CRd to an extension region ERd. The cut structure SCSd may include a narrow section NAd and a wide section WDd. A boundary BOd between the narrow section NAd and the wide section WDd may be disposed between the memory channel structures MCSd and the dummy channel structures DCSd.

The width of the narrow section NAd in a third direction D3 may be defined as a third width W3. The third width W3 of the narrow section NAd may be constant. The level of a bottom surface NAd_B of the narrow section NAd may be constant. The width of the wide section WDd in the third direction D3 may be defined as a fourth width W4. The fourth width W4 of the wide section WDd may be gradually increased as the wide section WDd extends away from the narrow section NAd. The fourth width W4 of the wide section WDd may be gradually increased as the wide section WDd extends away from the memory channel structures MCSd. The level of a bottom surface WDd_B of the wide section WDd may be gradually lowered as the wide section WDd extends away from the narrow section NAd. The level of the bottom surface WDd_B of the wide section WDd may be gradually lowered as the wide section WDd extends away from the memory channel structures MCSd. Since the width of the wide section WDd in the first direction D1 gradually increases as the wide section WDd extends away from the narrow section NAd, the fourth width W4 of the wide section WDd in a manufacturing process may be gradually increased as the wide section WDd extends away from the narrow section NAd.

A word line adjacent to a gate upper line from among word lines may be defined as a dummy word line DWL. The wide section WDd may extend through the dummy word line DWL. The wide section WDd may contact the dummy word line DWL. Although the wide section WDd is shown as extending through one dummy word line DWL, the example embodiments of the disclosure are not limited thereto, and the wide section WDd may extend through two or more dummy word lines.

The semiconductor device according to the example embodiments of the disclosure may include a cut structure having a width gradually increasing as the cut structure extends toward an extension region and, as such, electrical characteristics of the semiconductor device may be enhanced.

While the embodiments of the disclosure have been described with reference to the accompanying drawings, it should be understood by those skilled in the art that various modifications may be made without departing from the scope of the disclosure. Therefore, the above-described embodiments should be considered in a descriptive sense only and not for purposes of limitation.

What is claimed is:

1. A semiconductor device comprising:
   a peripheral circuit structure comprising a peripheral transistor;
   a semiconductor layer on the peripheral circuit structure;
   a source structure on the semiconductor layer;
   a gate stack structure on the source structure, the gate stack structure comprising a word line, a gate upper line, wherein ends of the word line and the gate upper line form a staircase structure;
   a plurality of memory channel structures in a first region of the semiconductor device and a plurality of dummy channel structures in a second region of the semiconductor device next to the first region, extending through the gate stack structure;
   a cut structure extending through the gate upper line between the first region and the second region, not extending through the word lines below the gate upper line; and
   a bit line overlapping with each of the plurality of memory channel structures,
   wherein the cut structure comprises a narrow section, and a wide section connected to the narrow section to be nearer to the staircase structure than the narrow section,
   wherein a width of the narrow section is less than a width of the wide section, the narrow section of the cut structure is in the first region, the wide section of the cut structure is in the second region and the staircase structure is in the second region.

2. The semiconductor device according to claim 1, wherein the wide section of the cut structure comprises first and second connecting surfaces the interconnect the side wall of the wide section and the side wall of the narrow section, and wherein the first and second connecting surface are not coplanar with the side wall of the wide section or the side wall of the narrow section, and a boundary between the narrow section and the wide section is between the memory channel structure and the plurality of dummy channel structures.

3. The semiconductor device according to claim 1, wherein the width of the wide section gradually increases as the wide section extends away from the plurality of memory channel structures.

4. The semiconductor device according to claim 1, wherein a minimum width of the wide section is greater than a maximum width of the narrow section.

5. The semiconductor device according to claim 1, wherein:
   the wide section comprises first and second side walls; and
   the plurality of dummy channel structures comprises a first dummy channel structure having at least a portion of the first dummy channel structure between the first and second side walls of the wide section.

6. The semiconductor device according to claim 5, wherein:
   the plurality of dummy channel structures comprises a second dummy channel structure adjacent to the first dummy channel structure;
   the second dummy channel structure extends into the wide section, and at least a portion of the second dummy channel structure extends through the first and second side walls of the wide section.

7. The semiconductor device according to claim 1, wherein the wide section comprises a connecting surface interconnecting a side wall of the wide section and a side wall of the narrow section.

8. A semiconductor device comprising:
   a gate stack structure comprising a word line and a gate upper line;
   memory channel structures and dummy channel structures extending through the gate stack structure; and
   a cut structure extending through the gate upper line,
   wherein the cut structure comprises a narrow section and a wide section, the wide section having a greater width than the narrow section,
   wherein the memory channel structures comprise at least a first memory channel structure, and the narrow section of the cut structure extends into the first memory channel structure,
   wherein the dummy channel structures comprise at least a first dummy channel structure, and the wide section of the cut structure extends into the first dummy channel structure.

9. The semiconductor device according to claim 8, wherein the wide section comprises a connecting surface interconnecting a side wall of the narrow section and a side wall of the wide section.

10. The semiconductor device according to claim 9, wherein the connecting surface is between the memory channel structures and the dummy channel structures.

11. The semiconductor device according to claim 9, wherein the connecting surface intersects the side wall of the narrow section and the side wall of the wide section.

12. The semiconductor device according to claim 8, further comprising:
    a separation structure connected to the cut structure.

13. The semiconductor device according to claim 8, wherein the first dummy channel structure is surrounded by the wide section.

14. The semiconductor device according to claim 8, wherein a minimum width of the wide section is equal to the width of the narrow section.

15. The semiconductor device according to claim 8, wherein the width of the wide section is constant.

16. An electronic system comprising;
a main substrate;
a semiconductor device on the main substrate; and
a controller electrically connected to the semiconductor device on the main substrate,
wherein the semiconductor device comprises:
a gate stack structure comprising a word line and a gate upper line,
a plurality of memory channel structures and a plurality of support structures extending through the gate stack structure, and
a cut structure extending through the gate upper line,
wherein the cut structure comprises a narrow section adjacent to at least one of the plurality of memory channel structures, and a wide section adjacent to at least one of the plurality of support structures,
wherein a width of the narrow section of the cut structure is less than a width of the wide section of the cut structure.

17. The electronic system according to claim 16, wherein:
the gate stack structure further comprises a staircase structure defined by steps formed by the word line and the gate upper line; and
the plurality of support structures extend through the staircase structure.

18. The electronic system according to claim 16, wherein:
the support structure comprises a plurality of support structures; and
the wide section is between the plurality of support structures.

19. The electronic system according to claim 16, wherein the width of the wide section gradually increases as the wide section extends toward the support structure.

20. The electronic system according to claim 16, wherein a minimum width of the wide section is at least 110 to 130 nm.

* * * * *